United States Patent
Ogawa et al.

(10) Patent No.: US 7,557,004 B2
(45) Date of Patent: Jul. 7, 2009

(54) METHOD FOR FABRICATING SEMICONDUCTOR DEVICE

(75) Inventors: Hiroyuki Ogawa, Kawasaki (JP); Hideyuki Kojima, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 413 days.

(21) Appl. No.: 11/594,856

(22) Filed: Nov. 9, 2006

(65) Prior Publication Data

US 2007/0293029 A1    Dec. 20, 2007

(30) Foreign Application Priority Data

Jun. 14, 2006    (JP)    ............... 2006-164418

(51) Int. Cl.
   *H01L 21/336*    (2006.01)
(52) U.S. Cl. .................. 438/266; 438/201; 438/258; 438/275; 438/283; 438/762; 257/E21.689; 257/E21.691
(58) Field of Classification Search .......... 438/155, 438/201, 257, 258, 266, 275, 279, 283, 585, 438/592, 761–763, 211, 981; 257/314–316, 257/350, 365, 392, E27.011, E27.081, E27.097, 257/E25.01, E25.014–E25.016, E21.623, 257/E21.625, E21.639, E21.645, E21.689, 257/324, 326, 500, E21.624, E21.637, E21.691, 257/E21.177, E21.179
   See application file for complete search history.

(56) References Cited

U.S. PATENT DOCUMENTS

| | | | |
|---|---|---|---|
| 6,759,706 B2* | 7/2004 | Kobayashi | ......... 257/314 |
| 7,361,543 B2* | 4/2008 | Steimle et al. | ......... 438/201 |
| 2001/0045590 A1* | 11/2001 | Kobayashi | ......... 257/298 |
| 2004/0169250 A1* | 9/2004 | Kobayashi | ......... 257/510 |
| 2004/0212019 A1* | 10/2004 | Shinohara et al. | ......... 257/368 |
| 2005/0224864 A1* | 10/2005 | Hashimoto et al. | ......... 257/315 |
| 2008/0283900 A1* | 11/2008 | Nakagawa et al. | ......... 257/321 |

FOREIGN PATENT DOCUMENTS

| | | |
|---|---|---|
| JP | 2004-356580 A | 12/2004 |
| JP | 2005-123524 A | 5/2005 |
| JP | 2005-311282 A | 11/2005 |

* cited by examiner

*Primary Examiner*—Matthew C Landau
*Assistant Examiner*—Joseph C Nicely
(74) *Attorney, Agent, or Firm*—Westerman, Hattori, Daniels & Adrian, LLP.

(57) ABSTRACT

The method for fabricating the semiconductor device includes the steps of: forming an insulating film 20, a conductive film 22 and an insulating film 24 over a semiconductor substrate 10 having a first to a third region; removing an insulating film 24, the conductive film 22 and an insulating film 20 formed in the second region and the third region; forming an insulating film 38 in the second region and the third region; removing the insulating film 24 in the first region and the insulating film 38 in the third region; forming an insulating film 44 in the third region; after a conductive film 52 has been formed, patterning the conductive films 22, 52 in the first region to form a gate electrode 58; and patterning the conductive film 52 to form gate electrodes 62 in the second region and the third region while removing the conductive film 52 over the gate electrode 58.

19 Claims, 18 Drawing Sheets

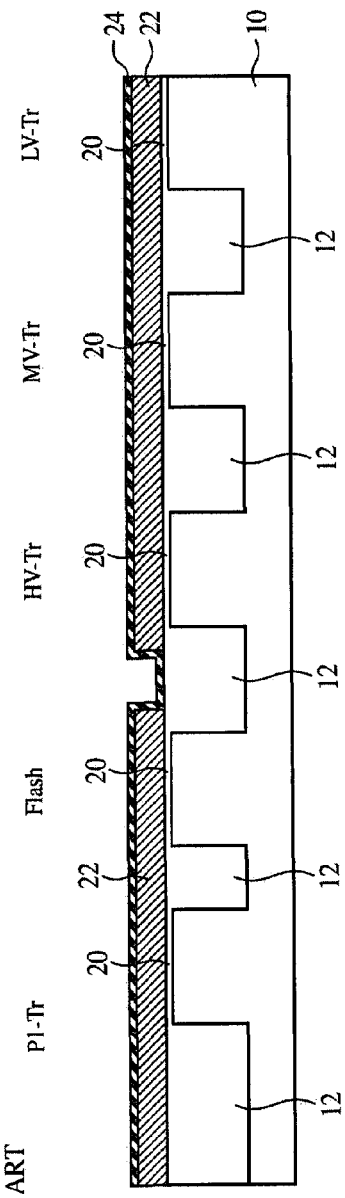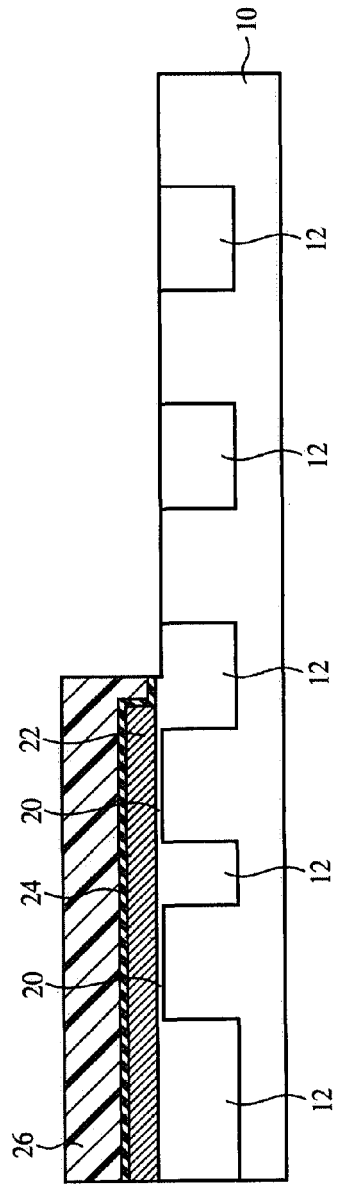
FIG. 1A
RELATED ART
FIG. 1B
RELATED ART

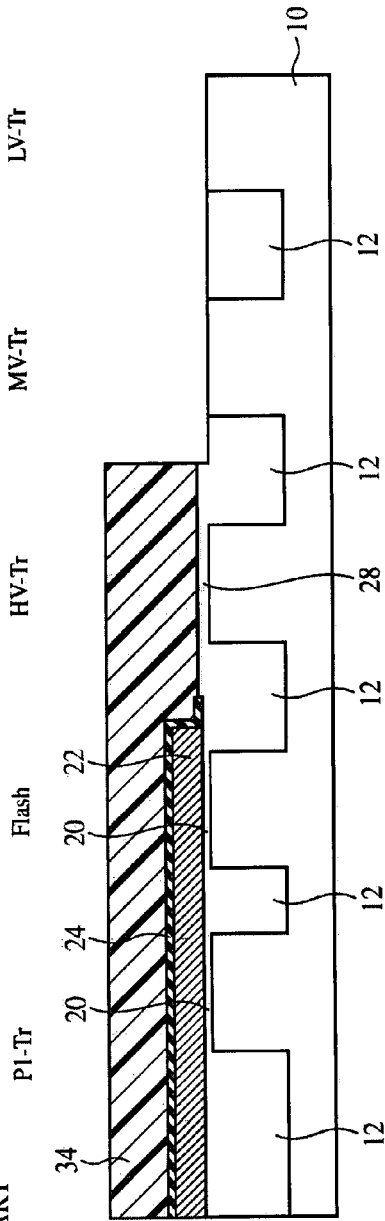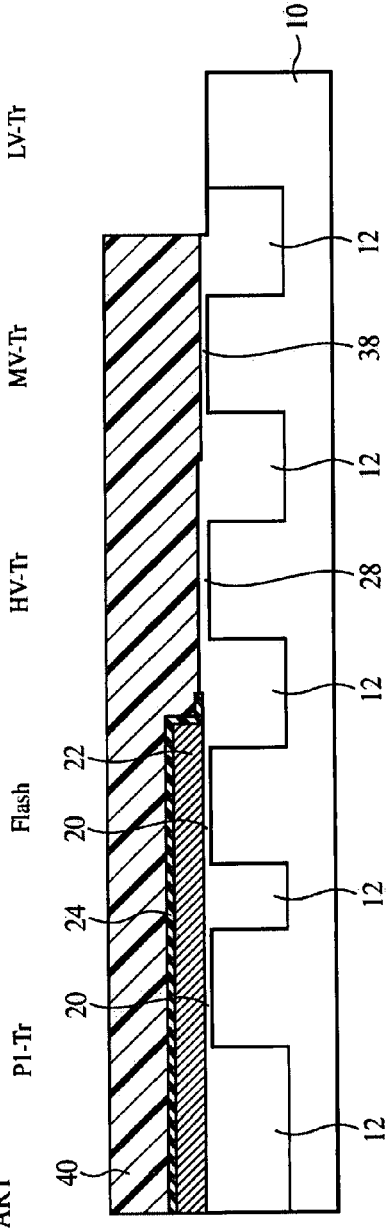
FIG. 2A RELATED ART
FIG. 2B RELATED ART

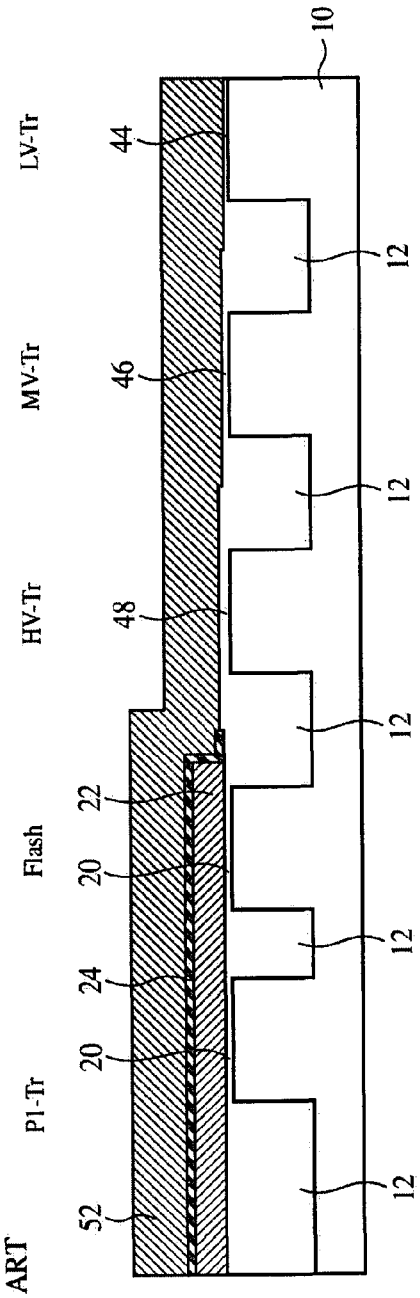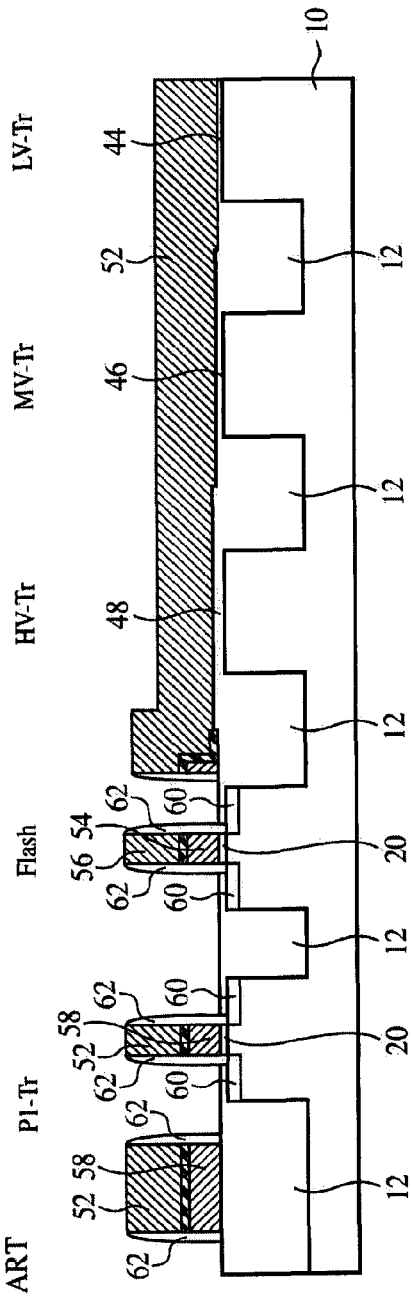
FIG. 3A RELATED ART
FIG. 3B RELATED ART

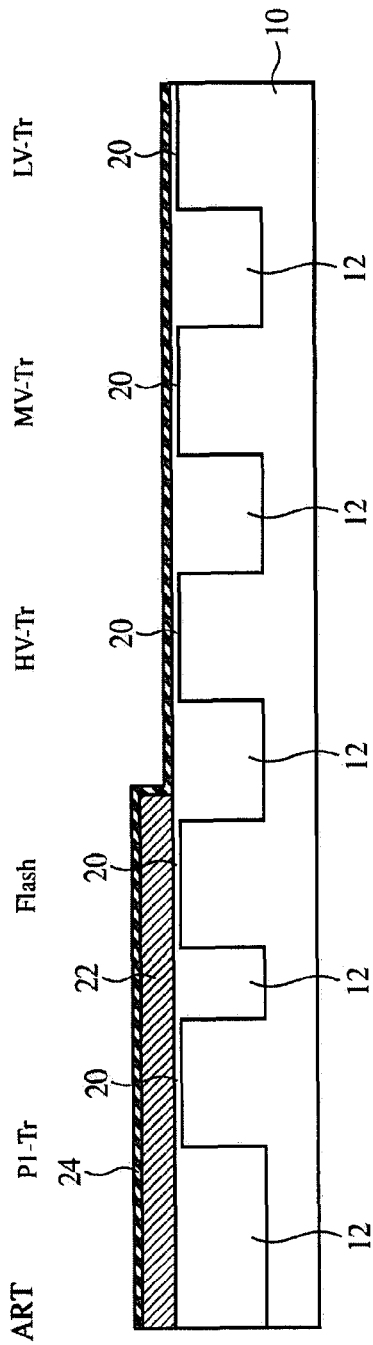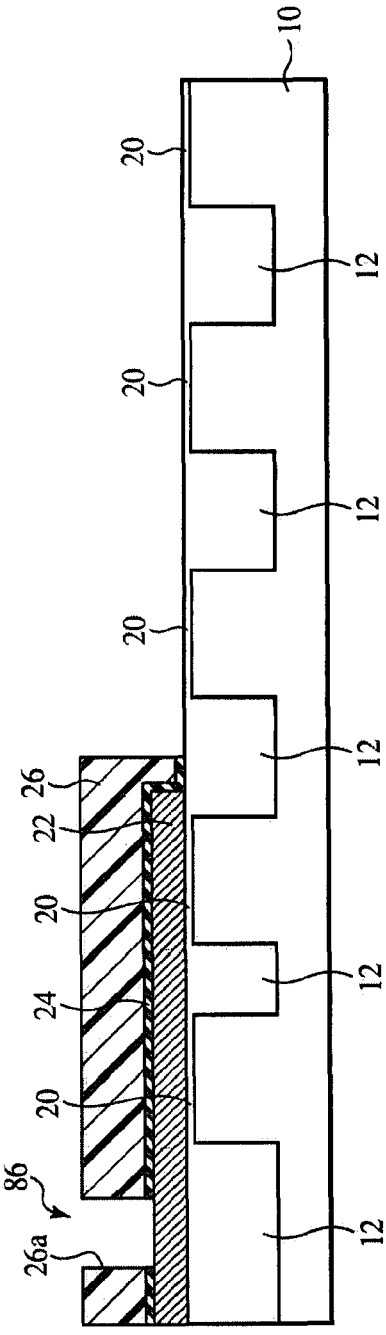
FIG. 5A
RELATED ART
FIG. 5B
RELATED ART

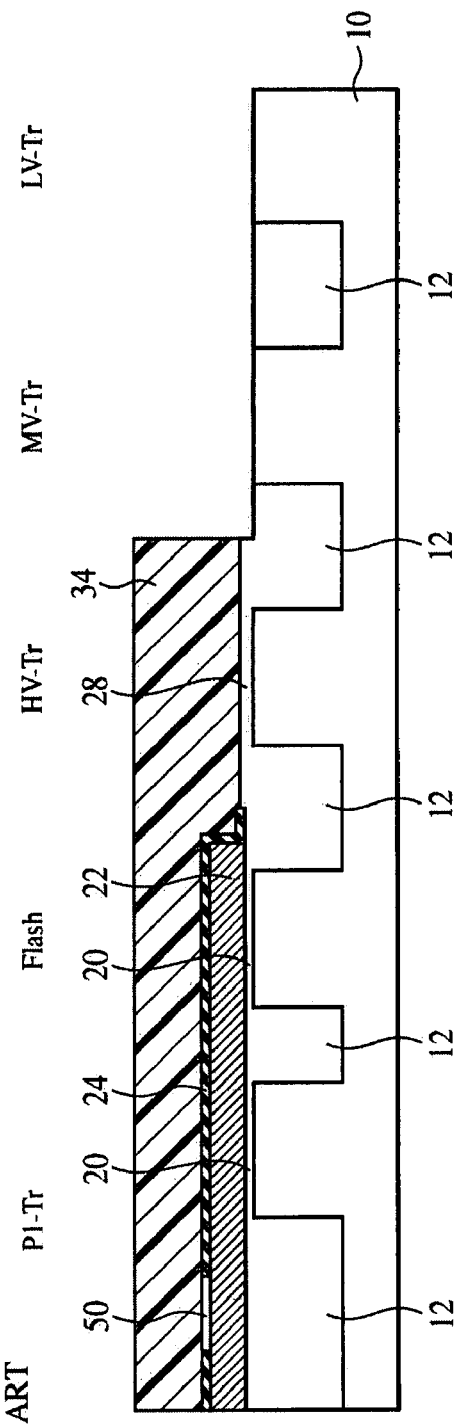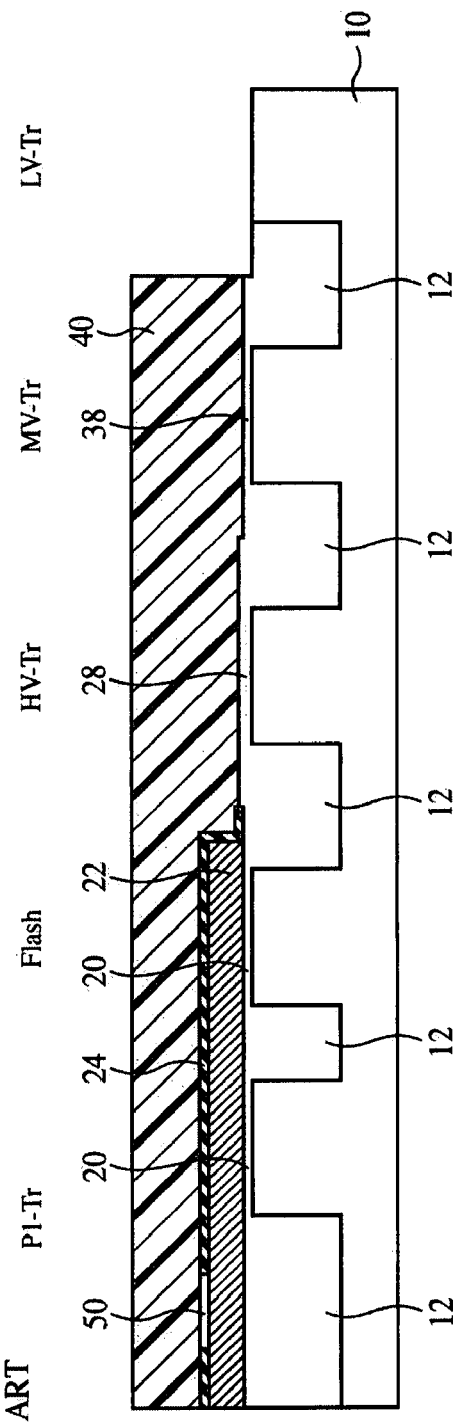
FIG. 6A RELATED ART
FIG. 6B RELATED ART

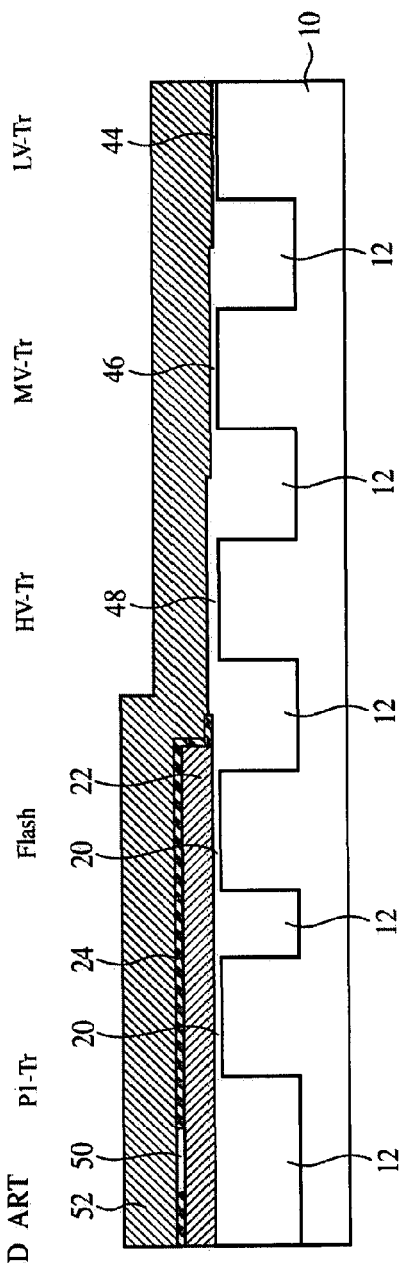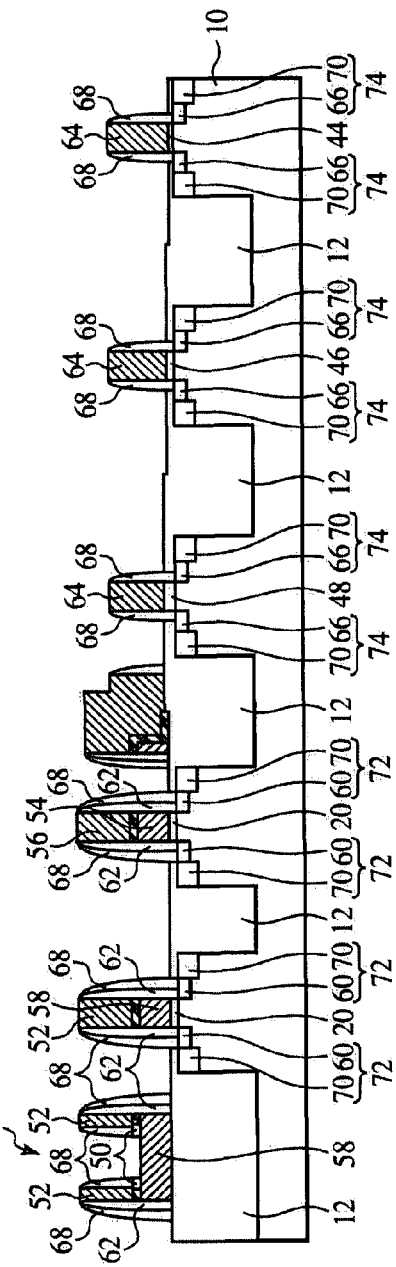
FIG. 7A
RELATED ART
FIG. 7B
RELATED ART

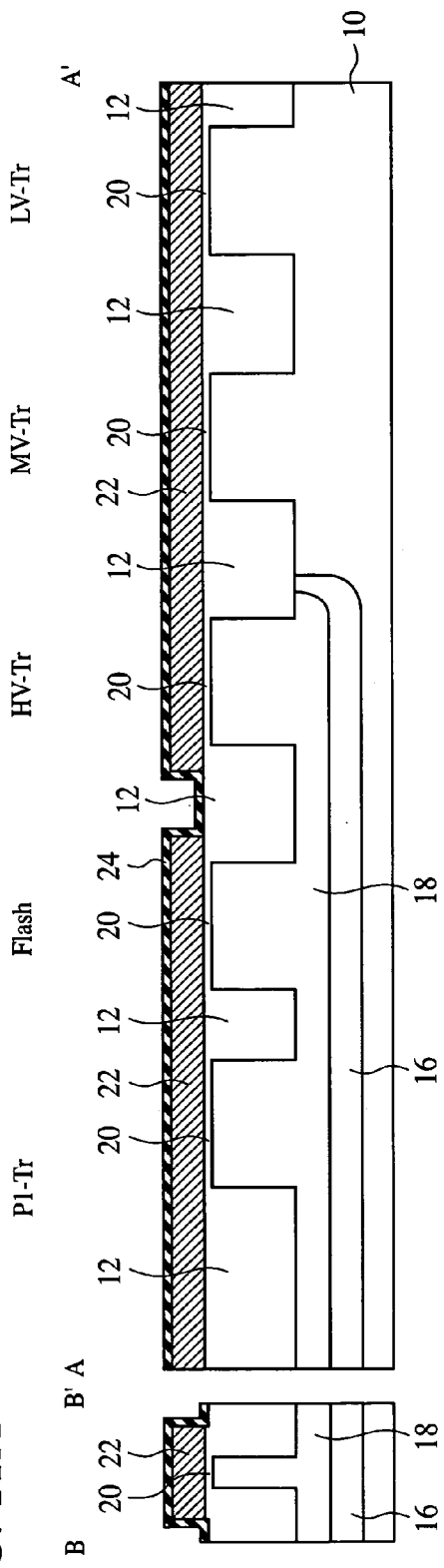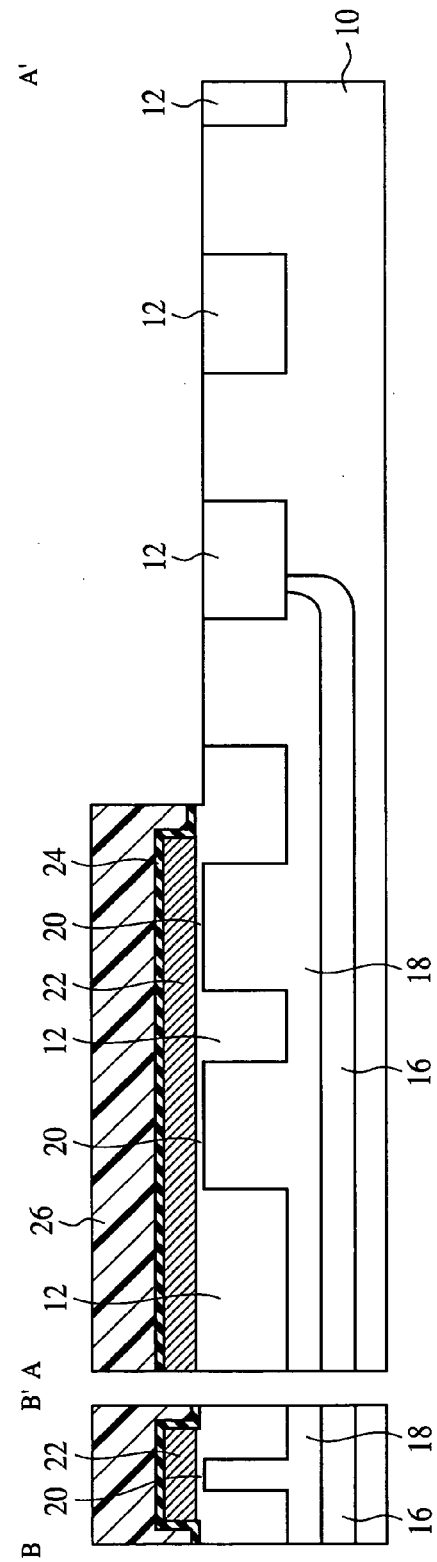
FIG. 11A
FIG. 11B

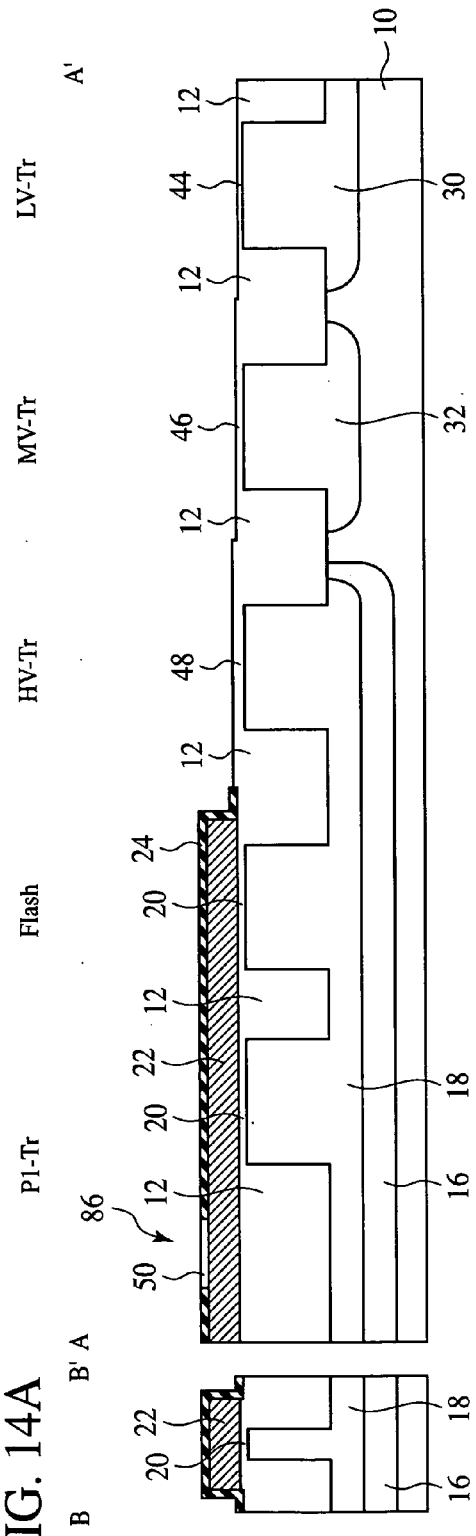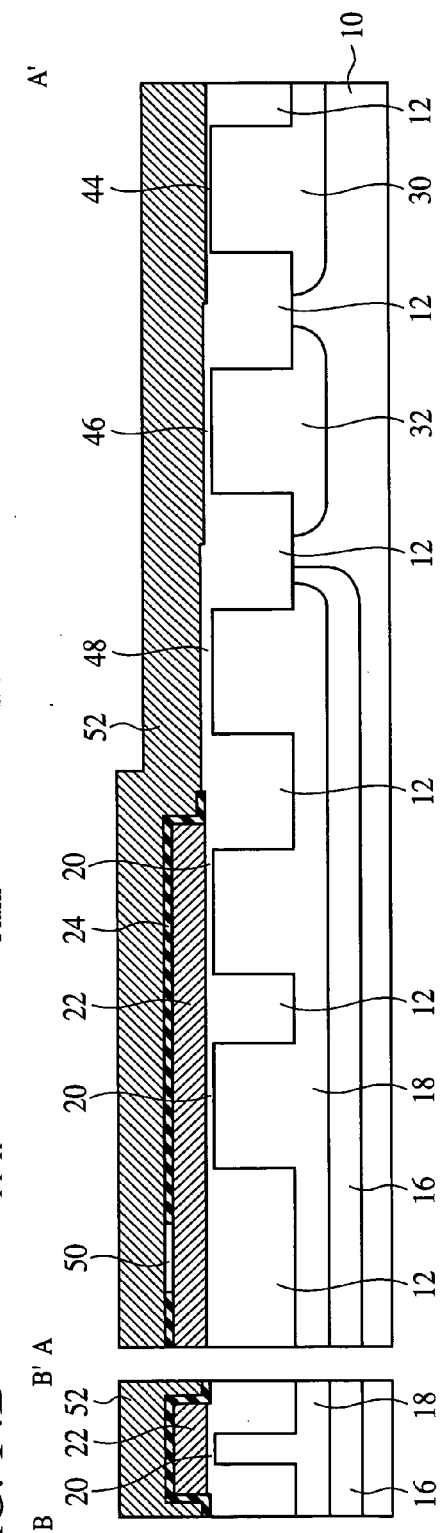

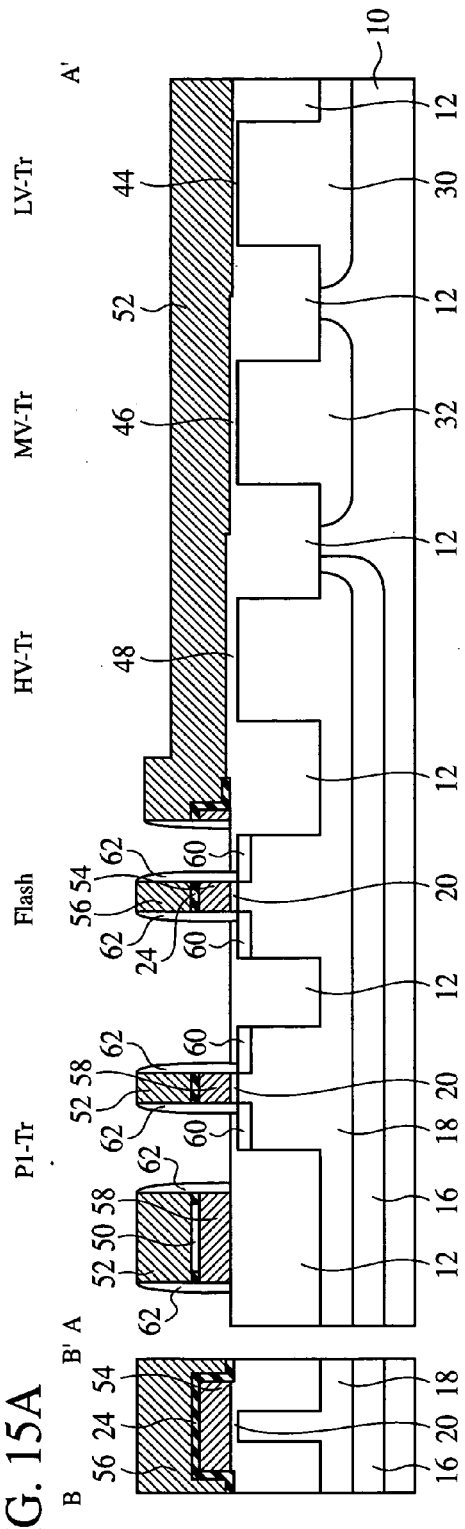
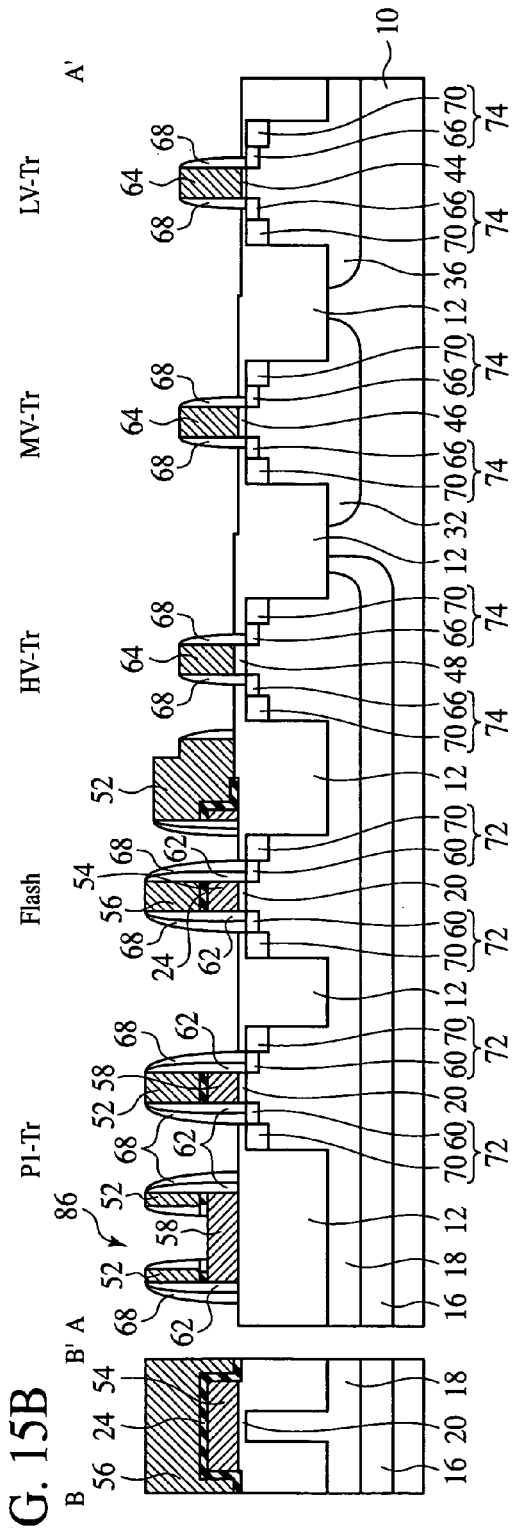
FIG. 15A
FIG. 15B

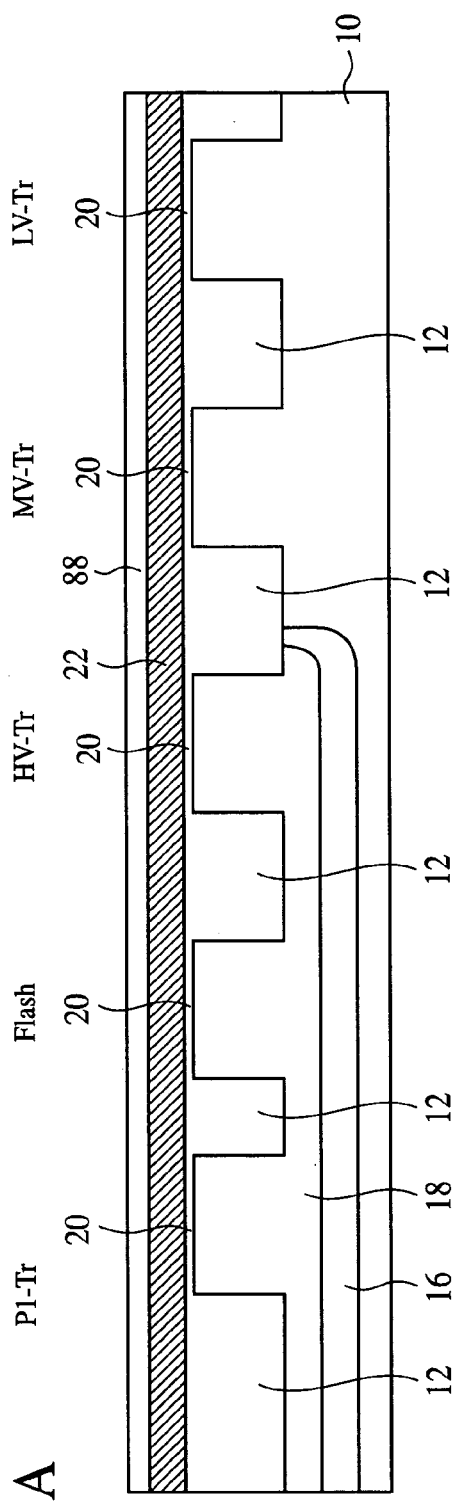
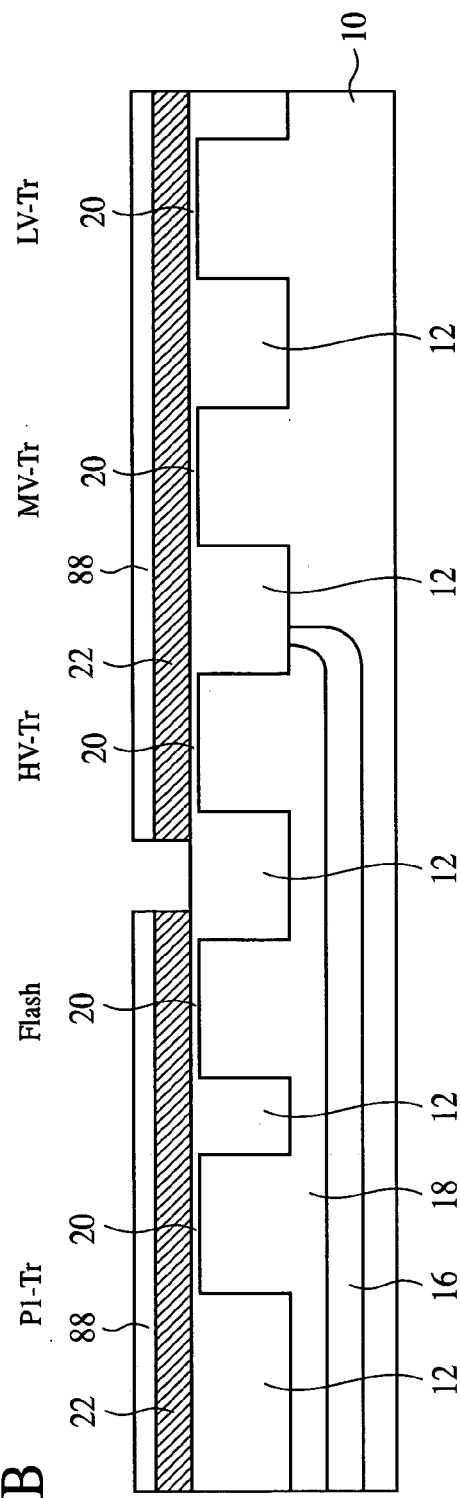
FIG. 17A
FIG. 17B

METHOD FOR FABRICATING SEMICONDUCTOR DEVICE

CROSS-REFERENCE TO RELATED APPLICATIONS

This application is based upon and claims the benefit of priority from the prior Japanese Patent Application No. 2006-164418, filed on Jun. 14, 2006, the entire contents of which are incorporated herein by reference.

BACKGROUND OF THE INVENTION

The present invention relates to a method for fabricating a semiconductor device, more specifically, a method for fabricating a logic semiconductor device combined with a nonvolatile memory.

The nonvolatile semiconductor memory cell, such as the flash memory, etc., includes a floating gate for accumulating charges in addition to a control gate for driving the transistor. The floating gate is an electrode which is electrically floating and requires no interconnection to be electrically connected thereto.

However, often an interconnection is electrically connected to a conductive layer which is simultaneously formed with and formed in the same interconnection level as the floating gate in accordance with requirements, etc. of the process control and the device structure/the fabrication process. For example, the process TEG (test element group) used in quality control, etc. of the tunnel gate insulating film includes a MOS capacitor having as the upper electrode the conductive layer formed in the same interconnection level as the floating gate. In the NAND flash memory cell, the conductive layer formed in the same interconnection level as the floating gate is often used as the gate electrode of the selective transistor.

Usually, the gate electrode of the flash memory cell of the stack gate structure has the floating gate formed of first-level polycrystalline silicon film and the control gate formed of second-level polycrystalline silicon film. The gate electrode of the peripheral transistor of the single-layer gate structure is formed of the second-level polycrystalline silicon film. Between the floating gate and the control gate, an inter-gate insulating film for insulating and capacitively coupling the electrodes with each other is formed. The inter-gate insulating film is formed typically of the layer film of silicon oxide film and silicon nitride film (e.g., ONO film) and is absent in the peripheral transistor region.

The first-level polycrystalline silicon film is processed simultaneously with the gate electrode of the flash memory cell and is covered with the inter-gate insulating film and the second-level polycrystalline silicon film. Accordingly, when an interconnection is formed in contact with the first-level polycrystalline silicon film, the inter-gate insulating film and the second-level polycrystalline silicon film formed over the first-level polycrystalline silicon film must be removed. Of these films, the second-level polycrystalline silicon film can be removed simultaneously with patterning the gate electrode of the peripheral transistor, but to remove the inter-gate insulating film, another step of removing the inter-gate insulating film is required.

As methods for removing the inter-gate insulating film formed over the first-level polycrystalline silicon film of the same level as the floating gate, the following three methods have been conventionally used.

In the first method, when a contact hole down to the silicon substrate and a contact hole down to the first-level polycrystalline silicon film are opened, the inter-gate insulating film over the first-level polycrystalline silicon film is removed.

In the second method, in the etching-back step for forming the sidewall insulating film on the side walls of the gate electrodes of the second-level polycrystalline silicon film, the inter-gate insulating film over the first-level polycrystalline silicon film is removed.

In the third method, when the second-level polycrystalline silicon film is patterned to form the gate electrode, the inter-gate insulating film over the first-level polycrystalline silicon film is removed.

The related arts are disclosed in, e.g., Reference 1 (Japanese published unexamined patent application No. 2005-123524), Reference 2 (Japanese published unexamined patent application No. 2005-311282), and Reference 3 (Japanese published unexamined patent application No. 2004-356580).

In the first method described above, the inter-gate insulating film over the first-level polycrystalline silicon film must be removed after the contact hole down to the substrate is completely opened, and the contact part of the substrate is damaged by the etching in the step of etching the inter-gate insulating film. The first method is not compatible with the borderless contact and is not applicable to the fabrication process for the flash memory cell combined with the leading logic device using the borderless contact.

The second and the third method described above require extra-etching for removing the inter-gate insulating film. According to this, characteristic changes of the peripheral transistor are often caused by the etching damages introduced into the silicon substrate and/or the film thickness decrease of the device isolation film by the etching-back step. This is serious especially when the gate insulating film of the peripheral transistor is thin. It is difficult to apply the second and the third methods to the fabrication process for the flash memory cell combined with the leading logic device.

As means for solving these problems, it is an idea to add the masking step for removing the inter-gate insulating film over the first-level polycrystalline silicon film, but unpreferably this adds to the step number and increases the fabrication cost.

As described above, it is difficult to apply the conventional methods for fabricating the flash memory cell, in which the interconnection is formed in contact with the first-level polycrystalline silicon film of the same level as the floating gate to the processing for fabricating the leading logic semiconductor device combined with the nonvolatile semiconductor memory.

SUMMARY OF THE INVENTION

An object of the present invention is to provide a method for fabricating a semiconductor device which facilitates the fabricating a logic semiconductor device combined with a nonvolatile semiconductor memory without making the fabricating process complicated and ensuring the compatibility with the fabrication process of the leading logic device.

According to one aspect of the present invention, there is provided a method of manufacturing a semiconductor device including a first transistor formed in a first region of a semiconductor substrate and having a first gate electrode of a first conductive film, a second transistor formed in a second region of the semiconductor substrate and having a second gate electrode of a second conductive film, and a third transistor formed in a third region of the semiconductor substrate and having a third gate electrode of the second conductive film, the method comprising the steps of: forming a first insulating film over the semiconductor substrate; forming the first conductive film over the first insulating film; forming a second insulating film over the first conductive film; removing the second insulating film, the first conductive film and the first insulating film formed in the second region and the third region; forming a third insulating film over the semiconductor substrate in the second region and the third region from which the first insulating film has been removed; removing the second insulating film in the first region and the third insulating film in the third region with a photoresist film covering the second region and exposing the first region and the third region as the mask; forming a fourth insulating film over the semiconductor substrate in the third region from which the third insulating film has been removed; forming the second conductive film over the first conductive film in the first region, the third insulating film in the second region and the fourth insulating film in the third region; patterning the second conductive film and the first conductive film in the first region to form the first gate electrode of the first conductive film; and patterning the second conductive film to form the second gate electrode and the third gate electrode while removing the second conductive film over the first gate electrode.

According to another aspect of the present invention, there is provided a method of manufacturing a semiconductor device including a first transistor formed in a first region of a semiconductor substrate and having a first gate electrode of a first conductive film, a second transistor formed in a second region of the semiconductor substrate and having a second gate electrode of a second conductive film, a third transistor formed in a third region of the semiconductor substrate and having a third gate electrode of the second conductive film, and a fourth transistor formed in a fourth region of the semiconductor substrate and having a fourth gate electrode of the second conductive film, the method comprising the steps of: forming a first insulating film over the semiconductor substrate; forming the first conductive film over the first insulating film; forming over the first conductive film a second insulating film including a first film, a second film formed on the first film and having etching characteristics different from those of the first film, and a third film formed on the second film and having etching characteristics different from those of the second film; removing the second insulating film, the first conductive film and the first insulating film formed in the second region, the third region and the fourth region; forming a third insulating film over the semiconductor substrate in the second region, the third region and the fourth region from which the first insulating film has been removed; removing the third film in the first region, and the third insulating film in the third region and the fourth region with a first resist film covering the second region and exposing the first region, the third region and the fourth region as a mask; forming a fourth insulating film over the semiconductor substrate in the third region and the fourth region from which the third insulating film has been removed; removing the second film and the first film in the first region, and the fourth insulating film in the fourth region with a second resist film covering the second region and the third region and exposing the first region and the fourth region as the mask; forming a fifth insulating film over the semiconductor substrate in the fourth region from which the fourth insulating film has been removed; forming the second conductive film over the first conductive film in the first region, the third insulating film in the second region, the fourth insulating film in the third region and the fifth insulating film in the fourth region; patterning the second conductive film and the first conductive film in the first region to form the first gate electrode of the first conductive film; and patterning the second conductive film to form the second gate electrode, the third gate electrode and the fourth gate electrode while removing the second conductive film over the first gate electrode.

According to the present invention, in the method for fabricating a logic semiconductor device combined with a nonvolatile memory transistor of the stack gate structure, in the multiple oxidation process for forming plural kinds of gate insulating films of different film thicknesses, the inter-gate insulating film in the region for the contact to the gate electrode of the conductive layer of the same level as the floating gate is removed, whereby the semiconductor substrate and the device isolation film are prevented from being damaged by the etching for removing the inter-gate insulating film. Thus, changes of the characteristics of the peripheral transistors can be prevented.

The inter-gate insulating film in the region for the contact to the gate electrode of the conductive layer of the same level as the floating gate can be only by adding to the mask pattern to be used in the multiple oxidation process the opening exposing the region for the contact to be formed, which makes it unnecessary to add a photoresist step, which much increases the fabrication cost.

Before the inter-layer insulating film is formed, the inter-gate insulating film in the region for the contact to the gate electrode of the conductive layer of the same level as the floating gate is removed in advance before the inter-layer insulating film is formed, which makes it possible to use the borderless contact.

Thus, the present invention is suitable to fabricate a logic semiconductor device combined with a nonvolatile semiconductor memory without making the fabrication process complicated, ensuring the compatibility with the fabrication process of the leading logic semiconductor devices.

BRIEF DESCRIPTION OF THE DRAWINGS

FIGS. 1A-1B, 2A-2B, 3A-3B and 4A-4B are sectional views showing the steps of the method for fabricating the semiconductor device according to a first reference embodiment of the present invention.

FIGS. 5A-5B, 6A-6B and 7A-7B are sectional views showing the steps of the method for fabricating the semiconductor device according to a second reference embodiment of the present invention.

FIGS. 10A-10B, 11A-11B, 12A-12B, 13A-13B, 14A-14B, 15A-15B and 16 are sectional views showing the steps of the method for fabricating the semiconductor device according to the first embodiment of the present invention.

FIGS. 17A-17B and 18A-18B are sectional views showing the steps of the method for fabricating the semiconductor device according to a second embodiment of the present invention.

DETAILED DESCRIPTION OF THE PREFERRED EMBODIMENTS

A First Reference Embodiment

Figure 4A:
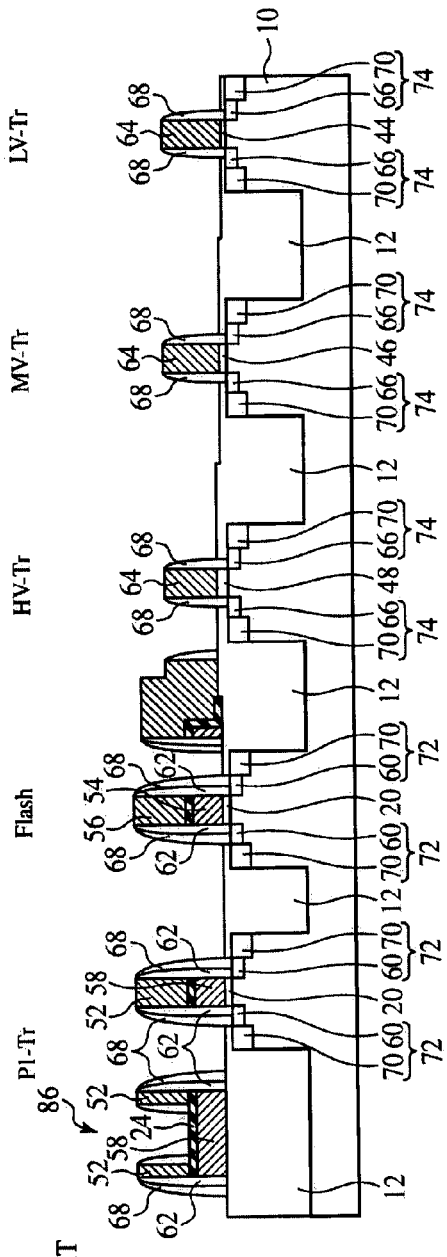

The method for fabricating the semiconductor device according to a first reference embodiment of the present invention will be explained with reference to FIGS. 1A to 4B.

FIGS. 1A to 4B are sectional views showing the steps of the method for fabricating the semiconductor device according to the present embodiment.

First, a device isolation film 12 for defining device regions is formed in a silicon substrate 10 by, e.g., STI (Shallow Trench Isolation) method. The device regions defined by the device isolation film 12 are, sequentially from the right side of the drawing, a low-voltage transistor (LV-Tr) region, a medium-voltage transistor (MV-Tr) region, a high-voltage transistor (HV-Tr) region, a nonvolatile memory transistor (Flash) region and a Poly-1 transistor (P1-Tr) region. For the details of the respective transistor, refer to the embodiments which will be described later.

Then, the silicon substrate 10 is thermally oxidized by, e.g., thermal oxidation method to form on the surfaces of the device regions a tunnel gate insulating film 20 of a silicon oxide film.

Then, on the silicon substrate 10 with the tunnel gate insulating film 20 formed on, a polycrystalline silicon film 22 is deposited by, e.g., CVD method.

Next, by photolithography and dry etching, the polycrystalline silicon film 22 in the memory cell region containing the nonvolatile memory transistor (Flash) region and the Poly-1 transistor (P1-Tr) region is patterned into prescribed configurations necessary to form the floating gate and the gate electrode of the Poly-1 transistor. The polycrystalline silicon film 22 in the peripheral circuit region containing the low-voltage transistor (LV-Tr) region, the medium voltage transistor (MV-Tr) region and the high-voltage transistor (HV-Tr) region remains.

Next, a silicon oxide film and a silicon nitride film are deposited on the entire surface by, e.g., CVD method, and then a silicon oxide film is grown by thermal oxidation to form an ONO film 24 of the silicon oxide film, the silicon nitride film and the silicon oxide film (FIG. 1A).

Next, a photoresist film 26 covering the memory cell region containing the nonvolatile memory transistor (Flash) region and the Poly-1 transistor (P1-Tr) region and exposing the peripheral circuit region containing the low-voltage transistor (LV-Tr) region, the medium-voltage transistor (MV-Tr) region and the high voltage transistor (HV-Tr) region is formed by photolithography.

Next, with the photoresist film 26 as the mask, the ONO film 24, the polycrystalline silicon film 22 and the tunnel gate insulating film 20 are etched to selectively remove the ONO film 24, the polycrystalline silicon film 22 and the tunnel gate insulating film 20 in the peripheral circuit region (FIG. 1B).

Next, the photoresist film 26 is removed by, e.g., ashing.

Then, the silicon substrate 10 is thermally oxidized by, e.g., thermal oxidation method to form a silicon oxide film 28 on the device regions in the low-voltage transistor (LV-Tr) region, the medium-voltage transistor (MV-Tr) region and the high-voltage transistor (HV-Tr) region.

Then, a photoresist film 34 exposing the low-voltage transistor (LV-Tr) region and the medium-voltage transistor (MV-Tr) region and covering the rest regions is formed by photolithography.

Next, with the photoresist film 34 as the mask wet etching is made with, e.g., a hydrofluoric acid aqueous solution. This etching removes the silicon oxide film 28 in the low-voltage transistor (LV-Tr) region and the medium-voltage transistor (MV-Tr) region (FIG. 2A).

Next, the photoresist film 34 is removed by, e.g., ashing.

Then, the silicon substrate 10 is thermally oxidized by, e.g., thermal oxidation method to form a silicon oxide film 38 on the device regions in the low-voltage transistor (LV-Tr) region and the medium-voltage transistor (MV-Tr) region. When the silicon oxide film 38 is formed, the silicon oxide film 28, which remains in the high-voltage transistor (HV-Tr) region, is additionally oxidized and increases the film thickness.

Then, a photoresist film 40 exposing the low-voltage transistor (LV-Tr) region and covering the rest regions is formed by photolithography.

Next, with the photoresist film 40 as the mask, wet etching is made with, e.g., a hydrofluoric acid aqueous solution. This etching removes the silicon oxide film 38 in the low-voltage transistor (LV-Tr) region (FIG. 2B).

Then, the photoresist film 40 is removed by, e.g., ashing.

Then, the silicon substrate 10 is thermally oxidized by, e.g., thermal oxidation method to form a gate insulating film 44 of a silicon oxide film on the device region in the low-voltage transistor (LV-Tr) region. When the gate insulating film 44 is formed, the silicon oxide film 38, which remains in the medium-voltage transistor (MV-Tr) region, and the silicon oxide film 28, which remains in the high-voltage transistor (HV-Tr) region are additionally oxidized. Thus, in the medium-voltage transistor (MV-Tr) region, the silicon oxide film is additionally oxidized, and a gate insulating film 46 which is thicker than the gate insulating film 44 is formed. In the high-voltage transistor (HV-Tr) region, the silicon oxide film 28 is additionally oxidized, and a gate insulating film 48 which is thicker than the gate insulating film 46 is formed.

Next, a polycrystalline silicon film 52 is deposited on the entire surface by, e.g., CVD method (FIG. 3A).

Then, by photolithography and dry etching, the polycrystalline silicon film 22, the ONO film 24 and the polycrystalline silicon film 52 in the memory cell region containing the nonvolatile memory transistor (Flash) region and the Poly-1 transistor (P1-Tr) region are patterned into the same configuration. Thus, a floating gate 54 of the polycrystalline silicon film 22 and a control gate 56 of the polycrystalline silicon film 52 are formed in the nonvolatile memory transistor (Flash) region, and in the Poly-1 transistor (P1-Tr) region, a gate electrode 58 of the Poly-1 transistor of the polycrystalline silicon film 22 is formed. The entire upper surfaces of the gate electrode 58 are covered by the polycrystalline silicon film 52 with the ONO film 24 formed therebetween.

Then, with the control gate 56, the floating gate 54, the gate electrode 58, etc. as the mask, ion implantation is made to form impurity diffused regions 60 to be the LDD regions or the extension regions of the nonvolatile memory transistor (Flash) and the Poly-1 transistor (P1-Tr) in the silicon substrate 10 on both sides of the control gate 56 and of the gate electrode 58.

Next, a silicon nitride film is deposited on the entire surface by, e.g., CVD method, and then the silicon nitride film is etched back to form a sidewall insulating film 62 of the silicon nitride film on the side walls of the control gate 56, the floating gate 54 and the gate electrode 58 (FIG. 3B).

Then, the polycrystalline silicon film 52 in the peripheral circuit region containing the low-voltage transistor (LV-Tr) region, the medium voltage transistor (MV-Tr) region and the high-voltage transistor (HV-Tr) region and in the Poly-1 transistor (P1-Tr) region is patterned by photolithography and dry etching. Thus, the gate electrodes 64 of the low-voltage transistor (LV-Tr), the medium voltage transistor (MV-Tr) and the high-voltage transistor (HV-Tr) are formed, while the polycrystalline silicon film 52 in the region 86 for the contact to the gate electrode 58 of the Poly-1 transistor (P1-Tr) is removed.

Then, ion implantation is made with the gate electrodes 64 and the photoresist film (not shown) covering the memory cell region as the mask to form impurity diffused regions 66 to be the LDD regions or the extension regions of the low-voltage transistor (LV-Tr), the medium transistor (MV-Tr) and the high-voltage transistor (HV-Tr) in the silicon substrate on both sides of the respective gate electrodes 64.

Next, a silicon oxide film is deposited on the entire surface by, e.g., CVD method, and then the silicon oxide film is etched back to form a sidewall insulating film 68 of the silicon oxide film on the side walls of the control gate 56, the floating gate 54 and the gate electrodes 58, 64.

Next, with the control gate 56, the floating gate 54, the gate electrodes 58, 64 and the sidewall insulating films 62, 68 as the mask, ion implantation is made to form impurity diffused regions 70 in the silicon substrate 10 on both sides respectively of the control gate 56 and of the gate electrodes 58, 64. Thus, source/drain regions 72 formed of the impurity diffused regions 60, 70 are formed in the silicon substrate 10 on both sides of the control gate 56 and the gate electrode 58, and source/drain regions 74 formed of the impurity diffused regions 66, 70 are formed in the silicon substrate 10 on both sides of the gate electrodes 64 (FIG. 4A).

Thus, the low-voltage transistor (LV-Tr) including the source/drain regions 74 and the gate electrode 64 is formed in the low-voltage transistor (LV-Tr) region, the medium-voltage transistor (MV-Tr) including the source/drain regions 74 and the gate electrode 64 is formed in the medium-voltage transistor (MV-Tr) region, the high-voltage transistor (HV-Tr) including the source/drain regions 74 and the gate electrode 64 is formed in the high-voltage transistor (HV-Tr) region, the nonvolatile memory transistor (Flash) including the source/drain regions 72, the floating gate 54 and the control gate 56 is formed in the nonvolatile memory transistor (Flash) region, and the Poly-1 transistor (P1-Tr) including the source/drain regions 72 and the gate electrode 58 is formed in the Poly-1 transistor (P1-Tr) region.

In the method for fabricating the semiconductor device according to the present reference embodiment, the ONO film 24 remain in the region 86 for the contact to the gate electrode 58 of the Poly-1 transistor (P1-Tr). To form the contact to the gate electrode 58, the ONO film 24 on the gate electrode 58 must be removed. Especially when metal silicide film is formed on the gate electrode 58 by salicide (self-aligned silicide) process, the ONO film 24 must be removed before the inter-layer insulating film for covering the transistors is formed.

To remove the ONO film 24, as described above, the ONO film will be removed simultaneously with forming the gate electrodes 64 or forming the sidewall insulating film 68. Both often cause characteristic changes of the peripheral transistors due to etching damages to the silicon substrate 10 and decreases of the film thickness of the device isolation film 12 by the etching back, and cannot be applied to the fabrication process for the flash memory cells combined with the leading logic devices.

Figure 4B:
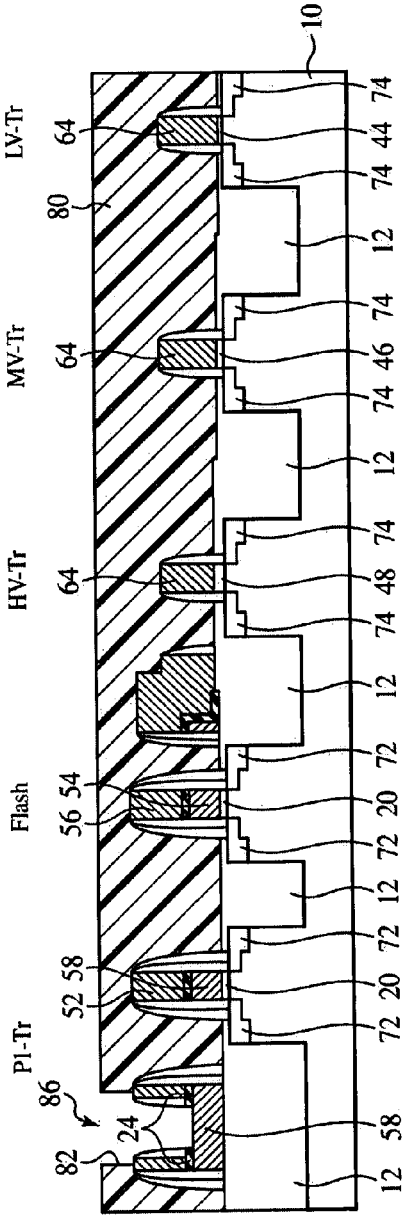

Accordingly, in the present embodiment, as shown in FIG. 4B, the ONO film 24 on the gate electrode 58 must be removed by adding the step of forming a photoresist film 80 having an opening 82 in the region 86 for the contact to the gate electrode 58 of the Poly-1 transistor (P1-Tr) to be formed in and the step of etching the ONO film 24 on the gate electrode 58 with the photoresist film 80 as the mask.

A Second Reference Embodiment

The method for fabricating the semiconductor device according to a second reference embodiment of the present invention will be explained with reference to FIGS. 5A to 7B.

FIGS. 5A to 7B are sectional views showing the steps of the method for fabricating the semiconductor device according to the present embodiment.

First, a device isolation film 12 for defining device regions is formed in a silicon substrate 10 by, e.g., STI (Shallow Trench Isolation) method. The device regions defined by the device isolation film 12 are, sequentially from the right side of the drawing, a low-voltage transistor (LV-Tr) region, a medium-voltage transistor (MV-Tr) region, a high-voltage transistor (HV-Tr) region, a nonvolatile memory transistor (Flash) region and a Poly-1 transistor (P1-Tr) region. For the details of the respective transistor, refer to the embodiments which will be described later.

Then, the silicon substrate 10 is thermally oxidized by, e.g., thermal oxidation method to form on the surfaces of the device regions a tunnel gate insulating film 20 of a silicon oxide film.

Then, on the silicon substrate 10 with the tunnel gate insulating film 20 formed on, a polycrystalline silicon film 22 is deposited by, e.g., CVD method.

Next, by photolithography and dry etching, the polycrystalline silicon film 22 in the memory cell region containing the nonvolatile memory transistor (Flash) region and the Poly-1 transistor (P1-Tr) region is patterned into prescribed configurations necessary to form the floating gate and the gate electrode of the Poly-1 transistor, while the polycrystalline silicon film 22 in the peripheral circuit region containing the low-voltage transistor (LV-Tr) region, the medium voltage transistor (MV-Tr) region and the high-voltage transistor (HV-Tr) region is removed.

Next, a silicon oxide film and a silicon nitride film are deposited on the entire surface by, e.g., CVD method, and then a silicon oxide film is grown by thermal oxidation to form an ONO film 24 of the silicon oxide film, the silicon nitride film and the silicon oxide film (FIG. 5A).

Then, a photoresist film 26 exposing the peripheral region containing the low-voltage transistor (LV-Tr) region, the medium-voltage transistor (MV-Tr) region and the high-voltage transistor (HV-Tr) region and having an opening 26a in the region for the contact to the gate electrode of the Poly-1 transistor (P1-Tr) is formed by photolithography.

Then, the ONO film 24 is etched with the photoresist film 26 as the mask to selectively remove the ONO film 24 in the peripheral circuit and the region 86 for the contact to the gate electrode of the Poly-1 transistor (P1-Tr) (FIG. 5B).

Next, the photoresist film 26 is removed by, e.g., ashing.

Next, the tunnel gate insulating film 20 in the peripheral circuit region is removed by wet etching using, e.g., a hydrofluoric acid aqueous solution.

Then, the silicon substrate 10 is thermally oxidized by, e.g., thermal oxidation method to form a silicon oxide film 28 on the device regions in the low-voltage transistor (LV-Tr) region, the medium-voltage transistor (MV-Tr) region and the high-voltage transistor (HV-Tr) region. At this time, the polycrystalline silicon film 22 in the region 86 for the contact to the gate electrode of the Poly-1 transistor (P1-Tr) is also thermally oxidized, and a silicon oxide film 50 is formed.

Next, a photoresist film 34 exposing the low-voltage transistor (LV-Tr) region and the medium-voltage transistor (MV-Tr) region and covering the rest region is formed by photolithography.

Next, with the photoresist film 34 as the mask wet etching is made with, e.g., a hydrofluoric acid aqueous solution. This etching removes the silicon oxide film 28 in the low-voltage transistor (LV-Tr) region and the medium-voltage transistor (MV-Tr) region (FIG. 6A).

Then, the photoresist film 34 is removed by, e.g., ashing.

Next, the silicon substrate 10 is thermally oxidized by, e.g., thermal oxidation method to form a silicon oxide film 38 on the device regions in the low-voltage transistor (LV-Tr) region and the medium-voltage transistor (MV-Tr) region. When the silicon oxide film 38 is formed, the silicon oxide film 28, which remains in the high-voltage transistor (HV-Tr) region, is additionally oxidized and increases the film thickness.

Next, a photoresist film 40 exposing the low-voltage transistor (LV-Tr) region and covering the rest region is formed by photolithography.

Next, with the photoresist film 40 as the mask, wet etching is made with, e.g., a hydrofluoric acid aqueous solution. This etching removes the silicon oxide film 38 in the low-voltage transistor (LV-Tr) region (FIG. 6B).

Next, the photoresist film 40 is removed by, e.g., ashing.

Then, the silicon substrate 10 is thermally oxidized by, e.g., thermal oxidation method to form a gate insulating film 44 of the silicon oxide film on the device region in the low-voltage transistor (LV-Tr) region. When the gate insulating film 44 is formed, the silicon oxide film 38, which remains in the medium-voltage transistor (MV-Tr) region, and the silicon oxide film 38, which remains in the high-voltage transistor (HV-Tr) region are additionally oxidized. Thus, in the medium-voltage transistor (MV-Tr) region, the silicon oxide film is additionally oxidized, and a gate insulating film 46 which is thicker than the gate insulating film 44 is formed. In the high-voltage transistor (HV-Tr) region, the silicon oxide film 28 is additionally oxidized, and a gate insulating film 48 which is thicker than the gate insulating film 46 is formed.

Next, a polycrystalline silicon film 52 is deposited on the entire surface by, e.g., CVD method (FIG. 7A).

Next, in the same way as in the first reference embodiment as exemplified in FIGS. 3B to 4A, the floating gate 54, the control gate 56 and the impurity diffused regions 60 of the nonvolatile memory transistor (Flash), the gate electrode 58 and the impurity diffused regions 60 of the Poly-1 transistor (P1-Tr), the sidewall insulating film 62, and the gate electrodes 64 and the impurity diffused regions 66 of the low-voltage transistor (LV-Tr), the medium-voltage transistor (MV-Tr) and the high-voltage transistor (HV-Tr) are formed.

Next, a silicon oxide film is deposited on the entire surface by, e.g., CVD method, and then the silicon oxide film is etched back to form a sidewall insulating film 68 of the silicon oxide film on the side walls of the control gate 56, the floating gate 54 and the gate electrodes 58, 64.

In etching for forming the sidewall insulating film 68, the silicon oxide film 50 formed on the gate electrode 58 of the Poly-1 transistor (P1-Tr) is also removed, and the upper surface of the gate electrode 58 is exposed.

Then, with the control gate 56, the floating gate 54, the gate electrodes 58, 64 and the sidewall insulating films 62, 68 as the mask, ion implantation is made to form impurity diffused regions 70 in the silicon substrate 10 on both sides of the control gate 56 and of the gate electrodes 58, 64. Thus, source/drain regions 72 formed of the impurity diffused regions 60, 70 are formed in the silicon substrate 10 on both sides of the control gate 56 and of the gate electrode 58, and source/drain regions 74 formed of the impurity diffused regions 66, 70 are formed in the silicon substrate 10 on both sides of the gate electrodes 64 (FIG. 7B).

Thus, the low-voltage transistor (LV-Tr) including the source/drain regions 74 and the gate electrode 64 is formed in the low-voltage transistor (LV-Tr) region, the medium-voltage transistor (MV-Tr) including the source/drain regions 74 and the gate electrode 64 is formed in the middle-voltage transistor (MV-Tr) region, the high-voltage transistor (HV-Tr) including the source/drain regions 74 and the gate electrode 64 is formed in the high-voltage transistor (HV-Tr) region, the nonvolatile memory transistor (Flash) including the source/drain regions 72, the floating gate 54 and the control gate 56 is formed in the nonvolatile memory transistor (Flash) region, and the Poly-1 transistor (P1-Tr) including the source/drain regions 72 and the gate electrode 68 is formed in the Ply 1 transistor (P1-Tr) region.

In the method for fabricating the semiconductor device fabricating method according to the present reference embodiment, in the step shown in FIG. 5B, the ONO film 24 in the region for the contact to the gate electrode 58 to the Poly-1 transistor (P1-Tr) formed in is removed together with the ONO film 24 in the peripheral circuit region is removed in advance, whereby the upper surface of the gate electrode 58 can be exposed in the etching for forming the sidewall insulating film 68. Accordingly, it is not necessary to add the step of masking for removing the ONO film 24 in the region for the contact to the gate electrode 58 of the Poly-1 transistor (P1-Tr), as is necessary in the first reference embodiment.

However, as the devices have been increasingly downsized, it has been found that the method for fabricating the semiconductor device according to the present reference embodiment cannot make the etching for patterning the polycrystalline silicon film 22 shown in FIG. 5A.

In the step of patterning the polycrystalline silicon film 22 shown in FIG. 5A, in the memory cell region, the etching must form the fine through-pattern having vertical configuration but must less damage the silicon substrate in the peripheral circuit region. Especially in the leading logic devices, the damage to the silicon substrate must be reduced as much as possible.

However, to reduce the etching damage and to pattern the fine and vertical configuration are contrary to each other in terms of setting the etching conditions, and as the devices are increasingly downsized, the process margins become much smaller. As the devices are further downsized, it becomes difficult to stably fabricate semiconductor devices, making the etching damage reduction and the fine patterning compatible.

To pattern the polycrystalline silicon film 22, a hard mask is often used as the pattern is more downsized. The hard mask is a film disposed below a photoresist film for compensating the etching resistance of the photoresist film, and is formed of silicon nitride film, silicon oxide film or others. In the process using the hard mask, the hard mask must be removed after the photoresist film has been removed.

Accordingly, when the hard mask process is used in the fabrication method according to the second reference embodiment, the etching step of removing the hard mask must be added after the step of patterning the polycrystalline silicon film 22, which may cause the problem of more damaging the silicon substrate.

A First Embodiment

The semiconductor device and the method for fabricating the same according to a first embodiment of the present invention will be explained with reference to FIGS. 8 to 16.

Figure 8:
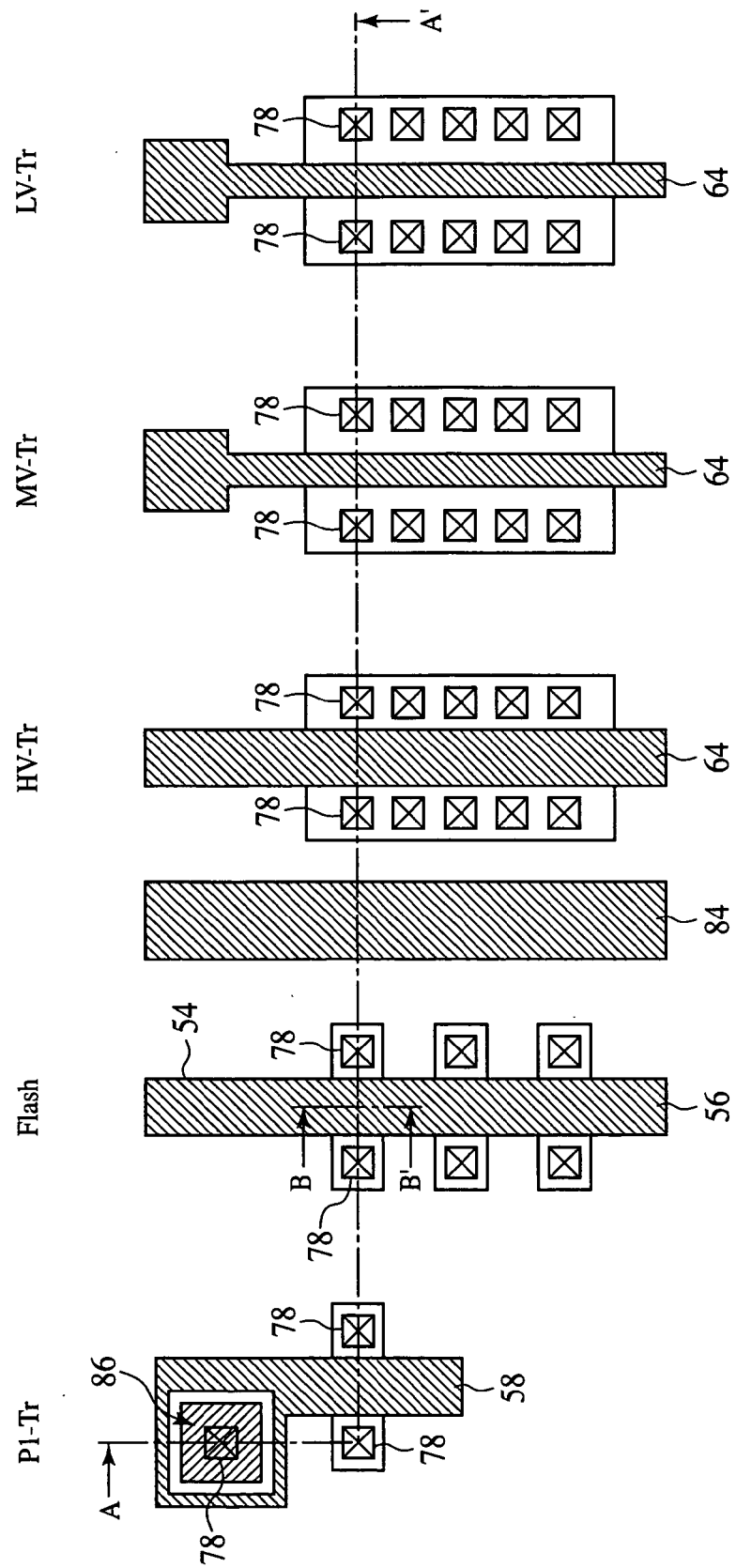
FIG. 8 is a plan view showing a structure of the semiconductor device according to a first embodiment of the present invention.
Figure 9:
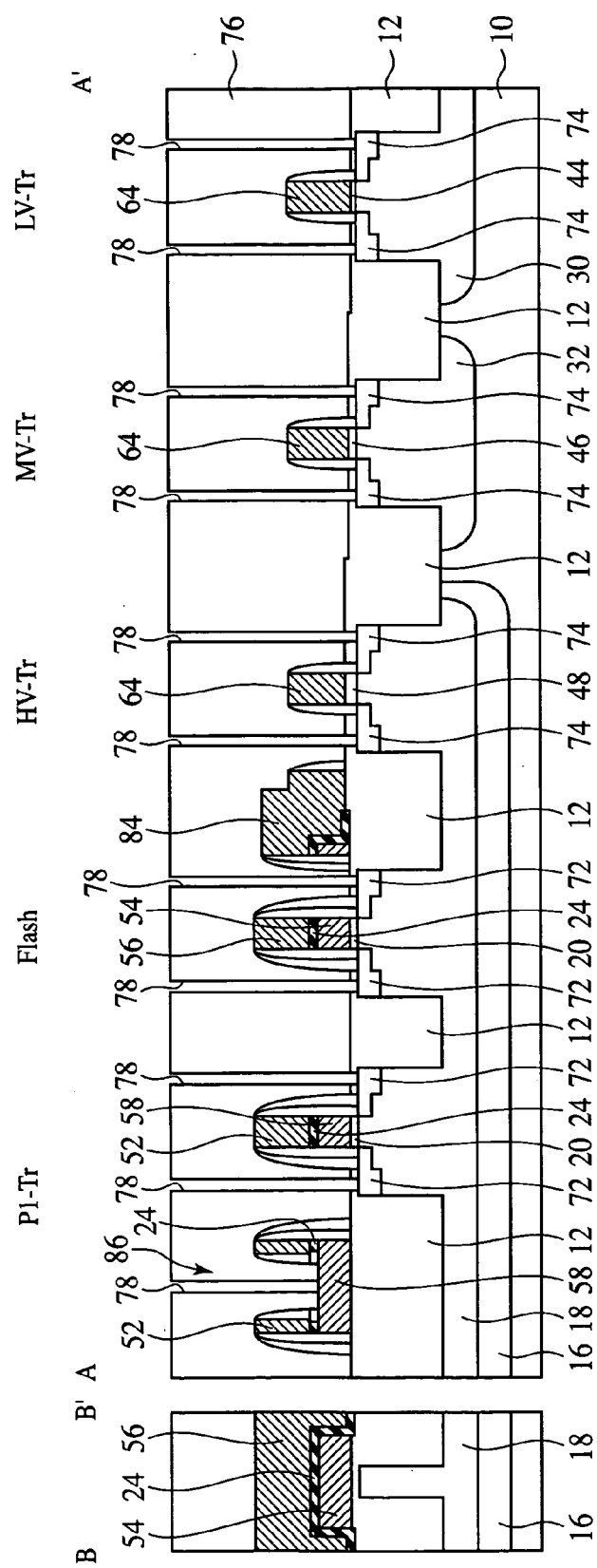
FIG. 9 is a diagrammatic sectional view showing a structure of the semiconductor device according to the first embodiment of the present invention.

FIG. 8 is a plan view showing a structure of the semiconductor device according to the present embodiment. FIG. 9 is a diagrammatic sectional view showing a structure of the semiconductor device according to the present embodiment. FIGS. 10A-16 are sectional views showing the steps of the method for fabricating the semiconductor device according to the present embodiment.

First, the structure of the semiconductor device according to the present embodiment will be explained with reference to FIGS. 8 and 9.

FIG. 8 shows a plan view of the typical transistors of logic semiconductor device combined with flash memory. FIG. 9 is the diagrammatic sectional view along the line A-A' and line B-B' in FIG. 8.

The respective transistors are, from the right side of FIG. 8 and FIG. 9, respectively a low-voltage transistor (LV-Tr), a medium-voltage transistor (MV-Tr), a high-voltage transistor (HV-Tr), a nonvolatile memory transistor (Flash) and a Poly-1 transistor (P1-Tr). A gate interconnection 84 remaining on the border between the flash memory region and the peripheral circuit region is illustrated between the high-voltage transistor (HV-Tr) and the nonvolatile memory transistor (Flash).

As shown in FIG. 9, the low-voltage transistor (LV-Tr) is formed in a p-well 30 formed in the silicon substrate 10 and includes a gate electrode 64 formed over the silicon substrate 10 with a gate insulating film 44 formed therebetween and source/drain regions 74 formed in the silicon substrate 10 on both sides of the gate electrode 64.

The low-voltage transistor (LV-Tr) is a transistor forming the main logic circuit, and the gate insulating film 44 is extra-thin for the performance improvement of the main logic circuit. In the present embodiment, only one n-channel transistor is shown as the low-voltage transistor (LV-Tr), but actually p-channel transistors are included. Plural kinds of low-voltage transistors of different threshold voltages are often formed.

As shown in FIG. 9, the medium-voltage transistor (MV-Tr) is formed in a p-well 32 formed in the silicon substrate 10 and includes a gate electrode 64 formed over the silicon substrate 10 with a gate insulating film 46 formed therebetween and source/drain regions 74 formed in the silicon substrate 10 on both sides of the gate electrode 64.

The medium-voltage transistor (MV-Tr) is a transistor for forming an input/output circuit which operates at a higher operational voltage than the low-voltage transistor (LV-Tr), and the gate insulating film is thicker than the low-voltage transistor (LV-Tr). In the present embodiment, only one n-channel transistor is shown as the medium-voltage transistor (MV-Tr), but actually p-channel transistors are included.

As shown in FIG. 9, the high-voltage transistor (HV-Tr) is formed in a p-well 18 formed in an n-well formed in the silicon substrate 10 and includes a gate electrode 64 formed over the silicon substrate 10 with a gate insulating film 48 formed therebetween, and source/drain regions 74 formed in the silicon substrate 10 on both sides of the gate electrode 64.

The high-voltage transistor (HV-Tr) is a transistor forming the control circuit of the nonvolatile memory cell and is a transistor of high voltage resistance to which about 5V is applied upon the reading of the nonvolatile memory cell, and voltages up to a little less than 10 V upon the writing and erasing. The control circuit of the nonvolatile memory cell, which treats such high voltages, has the gate insulating film made thicker than the medium-voltage transistor (MV-Tr). In the present embodiment, only one n-channel transistor is shown as the high-voltage transistor (HV-Tr), but actually, p-channel transistors are included. Plural kinds of high-voltage transistors of different threshold voltages are often formed.

As shown in FIG. 9, the nonvolatile memory transistor (Flash) is formed in the p-well 18 formed in the n-well 16 formed in the silicon substrate 10 and includes a floating gate 54 formed over the silicon substrate 10 with a tunnel gate insulating film 20 formed therebetween, a control gate 56 formed over the floating gate 54 with an ONO film 42 formed therebetween and source/drain regions 72 formed in the silicon substrate 10 on both sides of the control gate 56.

The nonvolatile memory transistor (Flash) is a flash EPROM of the stack gate structure and stores required information in the floating gate 54 as charges. The thickness of the tunnel gate insulating film 20 is decided independently for the charge retaining characteristics, the oxide film life, etc.

As shown in FIG. 9, the Poly-1 transistor (P1-Tr) is formed in the p-well 18 formed in the n-well 16 formed in the silicon substrate 10 and includes a gate electrode 58 formed over the silicon substrate 10 with a gate insulating film 20 formed therebetween and source/drain regions 72 formed in the silicon substrate 10 on both sides of the gate electrode 58.

The Poly-1 transistor (P1-Tr) has the gate electrode 58 formed of the first-level polycrystalline silicon film which is the same level as the floating gate of the nonvolatile memory transistor. The first-level polycrystalline silicon film is called "Poly-1" by those skilled in the art, and the transistor having the gate electrode formed of the first-level polycrystalline silicon film which is the same level as the floating gate of the nonvolatile memory transistor is often called "Poly-1 transistor". In the present specification as well, the transistor is called "Poly-1 transistor".

The gate electrode 58 of the Poly-1 transistor (P1-Tr) is formed by the same process as the floating gate 54 and the control gate 56 of the nonvolatile memory transistor (Flash). Accordingly, the gate electrode 58 has the stack structure of the first-level polycrystalline silicon film and the second-level polycrystalline silicon film stacked with the ONO film 24 formed therebetween and has the polycrystalline silicon film 52 and the ONO film 24 in the region for the contact to be formed in removed so as to form the contact to the gate electrode 58.

An inter-layer insulating film 76 is formed over the silicon substrate 10 with these transistors formed on. The contact holes 78 down to the source/drain regions 72, 74 of the respective transistors and the gate electrode 58 of the Poly-1 transistor (P1-Tr) are formed in the inter-layer insulating film 76.

Next, the method for fabricating the semiconductor device according to the present embodiment will be explained with reference to FIGS. 10A to 16.

First, a device isolation film 12 for defining the device regions is formed in the silicon substrate 10 by, e.g. STI (Shallow Trench Isolation) method. The device regions defined by the device isolation film 12 are, sequentially from the right side of the drawing, a low-voltage transistor (LV-Tr) region, a medium-voltage transistor (MV-Tr) region, a high-voltage transistor (HV-Tr) region, a nonvolatile memory transistor (Flash) region and a Poly-1 transistor (P1-Tr) region.

Figure 10A:
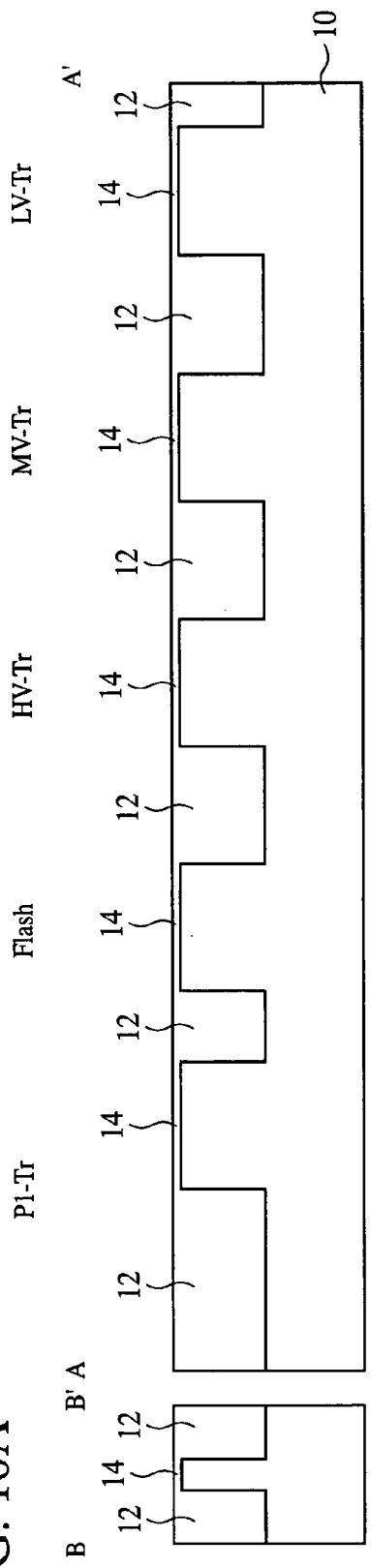

Then, the silicon oxide film 10 is thermally oxidized by, e.g., thermal oxidation method to form the silicon oxide film 14 as a sacrificial oxidation film (FIG. 10A).

Figure 10B:
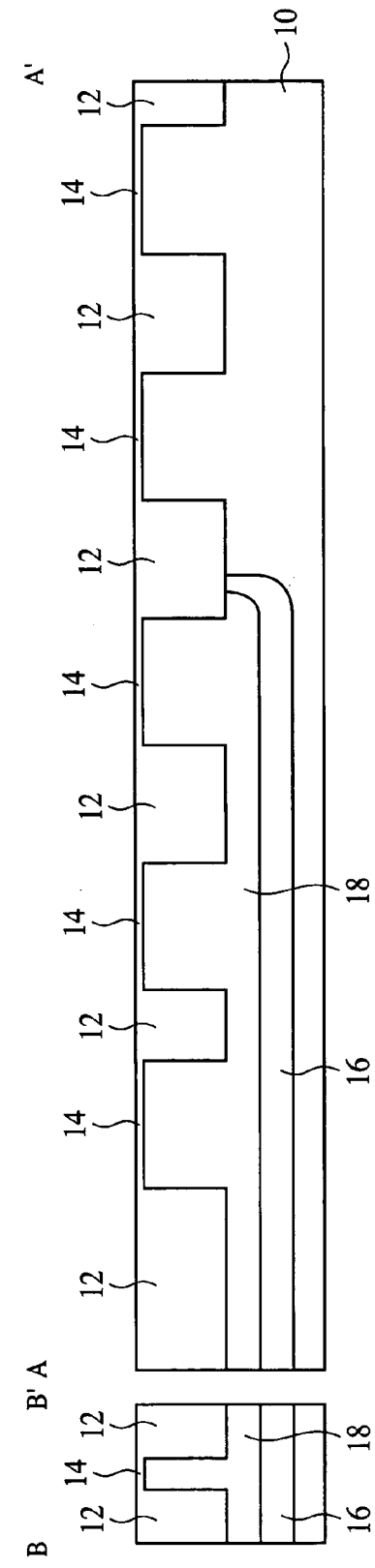

Next, ion implantation is made selectively in the memory cell region containing the nonvolatile memory transistor (Flash) region and the Poly-1 transistor (P1-Tr) region, and the high-voltage transistor (HV-Tr) region to form the n-well 16 and the p-well 18 in the silicon substrate 10 in the region for these transistors to be formed in (FIG. 10B). The p-well 18 is a double well formed in the n-well 16.

For the explanation, these wells 16, 18 are an n-well and a p-well here, but actually, these wells are formed by activating the implanted impurities in later thermal processing steps.

Next, the silicon oxide film 14 is removed with a hydrofluoric acid aqueous solution.

Next, the silicon substrate 10 is thermally oxidized by, e.g., thermal oxidation method to thereby form the tunnel gate insulating film 20 of a silicon oxide film on the surfaces of the device regions exposed by removing the silicon oxide film 14.

Next, on the silicon substrate 10 with the tunnel gate insulating film 20 formed on, a polycrystalline silicon film 22 is deposited by, e.g., CVD method.

Then, by photolithography and dry etching, the polycrystalline silicon film 22 in the memory cell region containing the nonvolatile memory transistor (Flash) region and the Poly-1 transistor (P1-Tr) region is patterned into prescribed configurations necessary to form the floating gate and the gate electrode of the Poly-1 transistor. The polycrystalline silicon film 22 in the peripheral circuit region containing the low-voltage transistor (LV-Tr) region, the medium-voltage transistor (MV-Tr) region and the high-voltage transistor (HV-Tr) region remains.

In this etching step, the etching must be able to process the fine through-patterns into the vertical configurations. As described above, to process fine patterns with vertical configurations and to decrease the etching damage are requirements which are contrary to each other in terms of setting the etching conditions.

In the method for fabricating the semiconductor device according to the present embodiment, however, in the peripheral circuit region covered by the polycrystalline silicon film 22, the silicon substrate 10 and the device isolation film 12 of the peripheral circuit region are never damaged by the etching in the step of etching the polycrystalline silicon film 22 in the memory cell region.

Thus, even when the devices are further downsized, the method for fabricating the semiconductor device according to the present embodiment can fabricate the semiconductor device stably while the etching damage decrease and the fine patterning are made compatible with each other.

Then, a silicon oxide film and a silicon nitride film are deposited on the entire surface by, e.g., CVD method, and then a silicon oxide film is grown by thermal oxidation to form the ONO film 24 of the silicon oxide film, the silicon nitride film, and the silicon oxide film (FIG. 11A).

Next, a photoresist film 26 covering the memory cell region containing the nonvolatile memory transistor (Flash) region and the Poly-1 transistor (P1-Tr) region and exposing the peripheral circuit region containing the low-voltage transistor (LV-Tr) region, the medium-voltage transistor (MV-Tr) region and the high-voltage transistor (HV-Tr) region is formed by photolithography.

Next, with the photoresist film 26 as the mask, the ONO film 24, the polycrystalline silicon film 22 and the tunnel gate insulating film 20 are etched to selectively remove the ONO film 24, the polycrystalline silicon film 22 and the tunnel gate insulating film 20 in the peripheral circuit region (FIG. 11B).

In this etching step, the peripheral circuit region is exposed to the etching atmosphere in etching the polycrystalline silicon film 22. However, for the etching of the polycrystalline silicon film 22 in this step, which doe not require the processing of fine patterning and vertical configurations, the etching conditions can be set for large process margins emphasizing the etching damage decrease. Accordingly, the polycrystalline silicon film 22 can be easily removed, sufficiently suppressing the etching damage to the base.

Then, the silicon substrate 10 is thermally oxidized by, e.g., thermal oxidation method to form a silicon oxide film 28 on the device regions in the low-voltage transistor (LV-Tr) region, the medium-voltage transistor (MV-Tr) region and the high-voltage transistor (HV-Tr) region. In place of the silicon oxide film 28, a silicon oxynitride film may be formed.

Figure 12A:
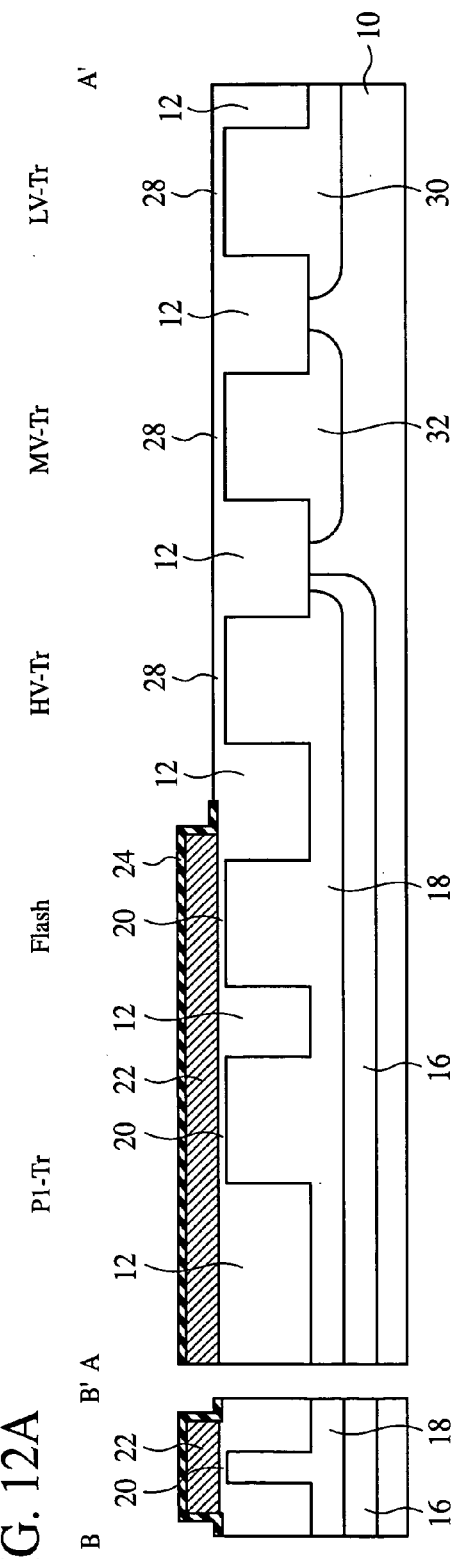

Then, ion implantation is selectively made respectively into the low-voltage transistor (LV-Tr) region and the medium-voltage transistor (MV-Tr) region to form the p-well 30 in the silicon substrate 10 in the low-voltage transistor (LV-Tr) region and the p-well 32 in the silicon substrate 10 in the medium-voltage transistor (MV-Tr) region (FIG. 12A).

For the explanation, the p-wells 30, 32 are wells here, but actually, these wells are formed by activating the impurities by thermal processing in later steps.

Then, a photoresist film 34 exposing the low-voltage transistor (LV-Tr) region and the medium-voltage transistor (MV-Tr) region and having an opening 36 in a region for the contact to the gate electrode of the Poly-1 transistor (P1-Tr) to be formed in is formed by photolithography.

Figure 12B:
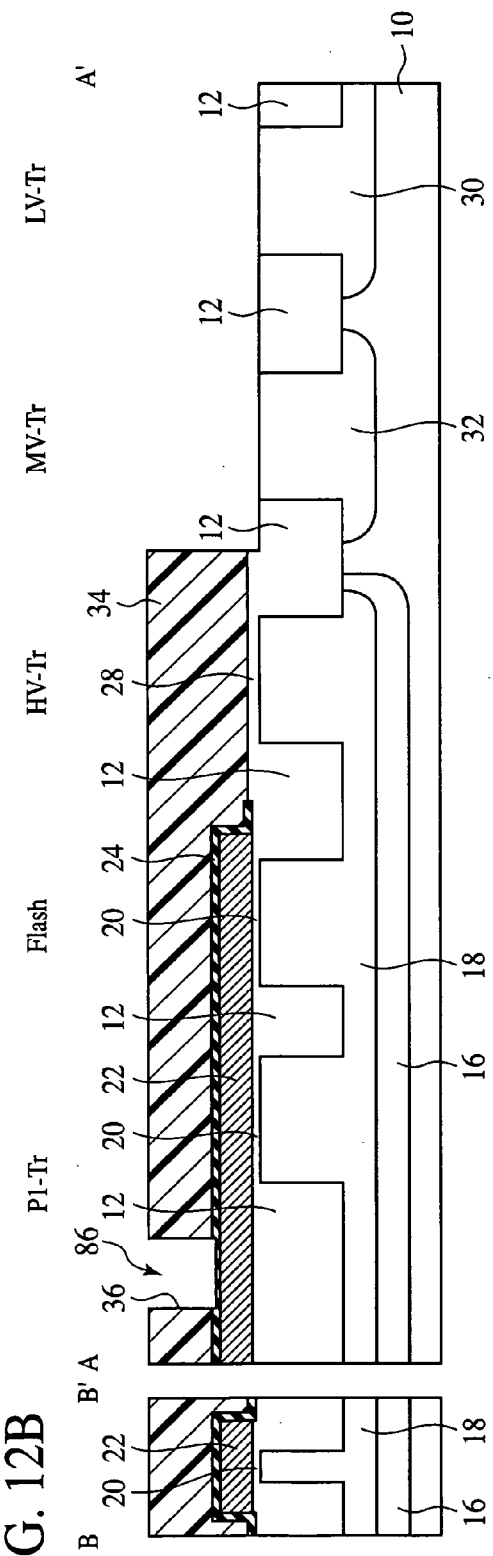

Next, with the photoresist film 34 as the mask, wet etching is made with, e.g., a hydrofluoric acid aqueous solution. This etching removes the silicon oxide film 28 in the low-voltage transistor (LV-Tr) region and the medium-voltage transistor (MV-Tr) region. Because of the opening 36 formed in the region for the contact to the gate electrode of the Poly-1 transistor (P1-Tr), the top oxide film of the ONO film 24 is simultaneously removed (FIG. 12B).

Next, the photoresist film 34 is removed by, e.g. ashing.

Figure 13A:
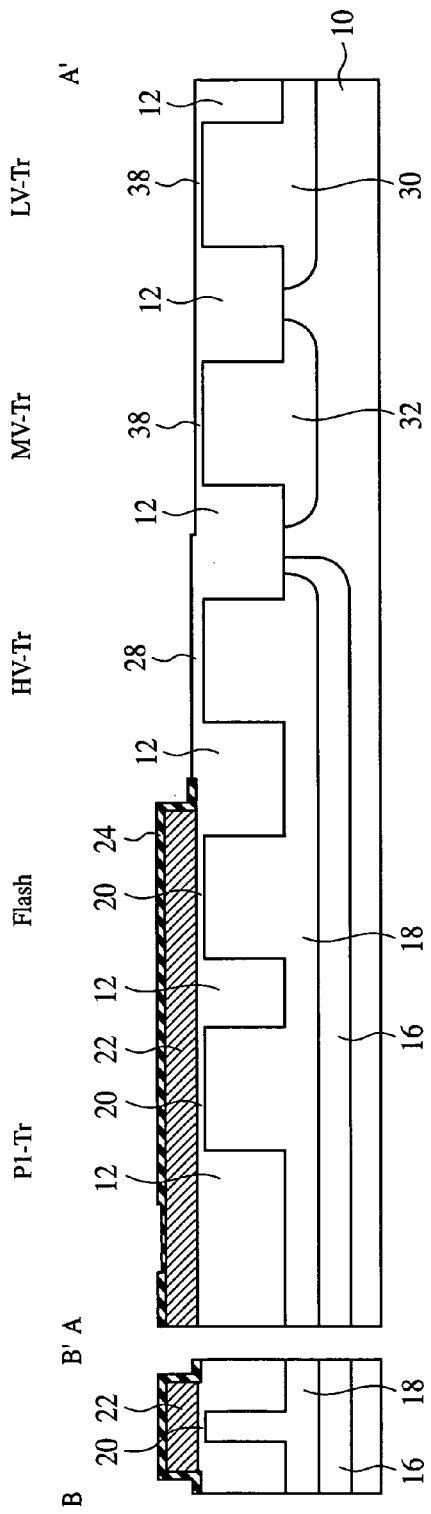

Then, the silicon substrate 10 is thermally oxidized by, e.g., thermal oxidation method to form a silicon oxide film 38 on the device regions in the low-voltage transistor (LV-Tr) region and the medium-voltage transistor (MV-Tr) region. When the silicon oxide film 38 is formed, the silicon oxide film 28, which remains in the high-voltage transistor (HV-Tr) region is additionally oxidized and increases the film thickness (FIG. 13A). In place of the silicon oxide film 38, a silicon oxynitride film may be formed.

Then, a photoresist film 40 exposing the low-voltage transistor (LV-Tr) region and having the opening 42 in the region for the contact to the gate electrode of the Poly-1 transistor (P1-Tr) is formed by photolithography.

Next, with the photoresist film 34 as the mask, dry etching is made to remove the silicon nitride film of the ONO film 24 exposed in the opening 42. The etching of the silicon nitride film can be made by RIE (Reactive Ion Etching) or CDE (Chemical Dry Etching) using $CH_xF_y$ gas (x and y are arbitrary) with oxygen ($O_2$), argon (Ar) or nitrogen ($N_2$) added as required, e.g., $CF_4+O_2$.

Silicon nitride film can be etched with high selectivity to silicon oxide film, and the film thickness decreases of the silicon oxide film 38 and the device isolation film 12 can be suppressed by the etching of the silicon nitride film. The silicon nitride film is not required to be patterned into the vertical configuration into which the polycrystalline silicon film is required to be patterned, and the patterns of the photoresist film 40 is relatively rough. Accordingly, the etching conditions can be set for wide process margins which stress the etching damage decrease, and the silicon nitride film can be easily removed while the etching damage to the base can be sufficiently suppressed.

Figure 13B:
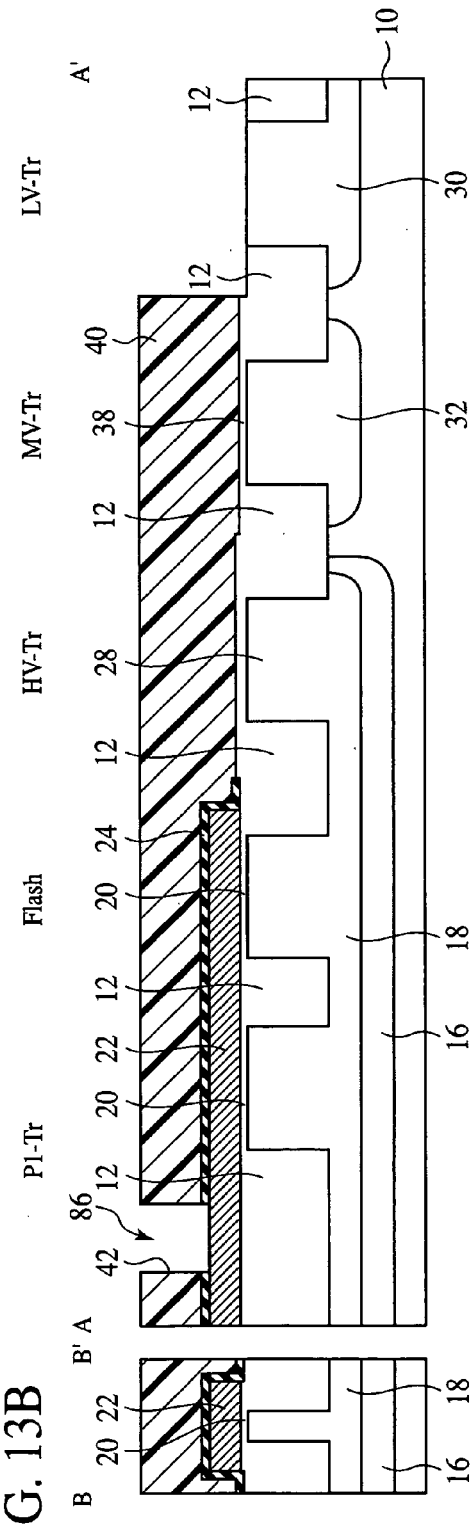

Then, with the photoresist film 40 as the mask, wet etching is made with, e.g., a hydrofluoric acid aqueous solution. This etching removes the silicon oxide film 38 in the low-voltage transistor (LV-Tr) region. Because of the opening formed in the region 86 for the contact to the gate electrode of the Poly-1 transistor (P1-Tr), the bottom oxide film of the ONO film 24 is simultaneously removed, and the polycrystalline silicon film 22 is exposed (FIG. 13B).

Then, the photoresist film 40 is removed by, e.g., ashing.

Next, the silicon substrate 10 is thermally oxidized by, e.g., thermal oxidation method to form the gate insulating film 44 of a silicon oxide film on the device region in the low-voltage transistor (LV-Tr) region. When the gate insulating film 44 is formed, the silicon oxide film 38, which remains in the medium-voltage transistor (MV-Tr) region, and the silicon oxide film 28, which remains in the high-voltage transistor (HV-Tr) region are additionally oxidized.

Thus, the so-called multiple oxidation process forms the gate insulating film 46 formed of the additionally oxidized silicon oxide film 38 and is thicker than the gate insulating film 44 in the medium-voltage transistor (MV-Tr) region, and in the high-voltage transistor (HV-Tr) region, the gate insulating film 48 formed of the additionally oxidized silicon oxide film 28 and is thicker than the gate insulating film 46 is formed.

When the gate insulating film 44 is formed, the gate insulating films 44, 46, 48 of the silicon oxynitride film may be formed by conducting oxynitridation.

The polycrystalline silicon film 22 exposed in the region 86 for the contact to the gate electrode of the Poly-1 transistor (P1-Tr) is oxidized simultaneously with forming the gate insulating films 44, 46, 48, and the silicon oxide film 50 is formed on the surface (FIG. 14A).

Then, a polycrystalline silicon film 52 is deposited on the entire surface by, e.g., CVD method (FIG. 14B).

Next, by photolithography and dry etching, the polycrystalline silicon film 22, the ONO film 24 and the polycrystalline silicon film 52 in the memory cell region containing the nonvolatile memory transistor (Flash) region and the Poly-1 transistor (P1-Tr) region are patterned into the same configuration. Thus, the floating gate 54 of the polycrystalline silicon film 22 and the control gate 56 of the polycrystalline silicon film 52 are formed in the nonvolatile memory transistor (Flash) region, and the gate electrode 58 of the Poly-1 transistor of the polycrystalline silicon film 22 is formed in the Poly-1 transistor (P1-Tr) region.

Next, with the control gate 56, the floating gate 54, the gate electrodes 58, etc. as the mask, ion implantation is made to form impurity diffused regions 60 to be the LDD regions or the extension regions of the nonvolatile memory transistor (Flash) and the Poly-1 transistor (P1-Tr) in the silicon substrate 10 on both sides of the control gate 56 and the gate electrodes 58.

Then, a silicon nitride film is deposited on the entire surface by, e.g., CVD method, and the silicon nitride film is etched back to form a sidewall insulating film 62 of the silicon nitride film on the side walls of the control gate 56, the floating gate 54 and the gate electrodes 58 (FIG. 15A).

Then, the polycrystalline silicon film 52 in the peripheral circuit region containing the low-voltage transistor (LV-Tr) region, the medium-voltage transistor (MV-Tr) region and the high-voltage transistor (HV-Tr) region, and in the Poly-1 transistor (P1-Tr) region is patterned by photolithography and dry etching. Thus, the gate electrodes 64 of the low-voltage transistor (LV-Tr), the medium-voltage transistor (MV-Tr) and the high voltage transistor (HV-Tr) are formed, while the polycrystalline silicon film 52 in the region 86 for the contact to the gate electrode 58 of the Poly-1 transistor (P1-Tr) is removed.

Next, ion implantation is made with a photoresist film (not shown) covering the memory cell region, and the gate electrodes 64 as the mask to form the impurity diffused regions 66 to be the LDD regions or the extension regions of the low-voltage transistor (LV-Tr), the medium-voltage transistor (MV-Tr) and the high-voltage transistor (HV-Tr) in the silicon substrate 10 on both sides of the gate electrodes 64.

Then, a silicon oxide film is deposited on the entire surface by, e.g., CVD method, and the silicon oxide film is etched back to form the sidewall insulating film 68 of the silicon oxide film on the side walls of the control gate 56, the floating gate 54 and the gate electrodes 58, 64.

In the etching for forming the sidewall insulating film 68, the silicon oxide film 50 which has been formed on the gate electrode 58 is removed, and the upper surface of the gate electrode 58 is exposed in the region 86 for the contact to be formed in.

Then, with the control gate 56, the floating gate 54, the gate electrodes 58, 64 and the sidewall insulating films 62, 68 as the mask, ion implantation is made to form the impurity diffused regions 70 in the silicon substrate 10 on both sides respectively of the control gate 56 and the gate electrodes 58, 64. Thus, in the silicon substrate 10 on both sides of the control gate 56 and the gate electrode 58, the source/drain regions 72 formed of the impurity diffused regions 60, 70 are formed, and the source/drain regions 74 formed of the impurity diffused regions 66, 70 are formed in the silicon substrate 10 on both sides of the gate electrodes 64.

Next, a metal silicide film (not shown) is formed as required by salicide process on the source/drain regions 72, 74 and the gate electrodes of the respective transistors (the gate electrodes 64, the control gate 62 and the gate electrode 58 of the Poly-1 transistor).

Thus, in the low-voltage transistor (LV-Tr) region, the low-voltage transistor (LV-Tr) including the source/drain regions 74 and the gate electrode 64 is formed, in the medium-voltage transistor (MV-Tr) region, the medium-voltage transistor (MV-Tr) including the source/drain regions 74 and the gate electrode 64 is formed, in the high-voltage transistor (HV-Tr) region, the high-voltage transistor (HV-Tr) including the source/drain regions 74 and the gate electrode 64 is formed, in the nonvolatile memory transistor (Flash) region, the nonvolatile memory transistor (Flash) including the source/drain regions 72, the floating gate 54 and the control gate 56 is formed, and in the Poly-1 transistor (P1-Tr) region, the Poly-1 transistor (P1-Tr) including the source/drain regions 72 and the gate electrode 58 is formed.

Next, on the silicon substrate 10 with the transistors formed on, a silicon nitride film and a silicon oxide film are deposited by, e.g., CVD method to form the inter-layer insulating film 76 of the layer film of these insulating films.

Figure 16:
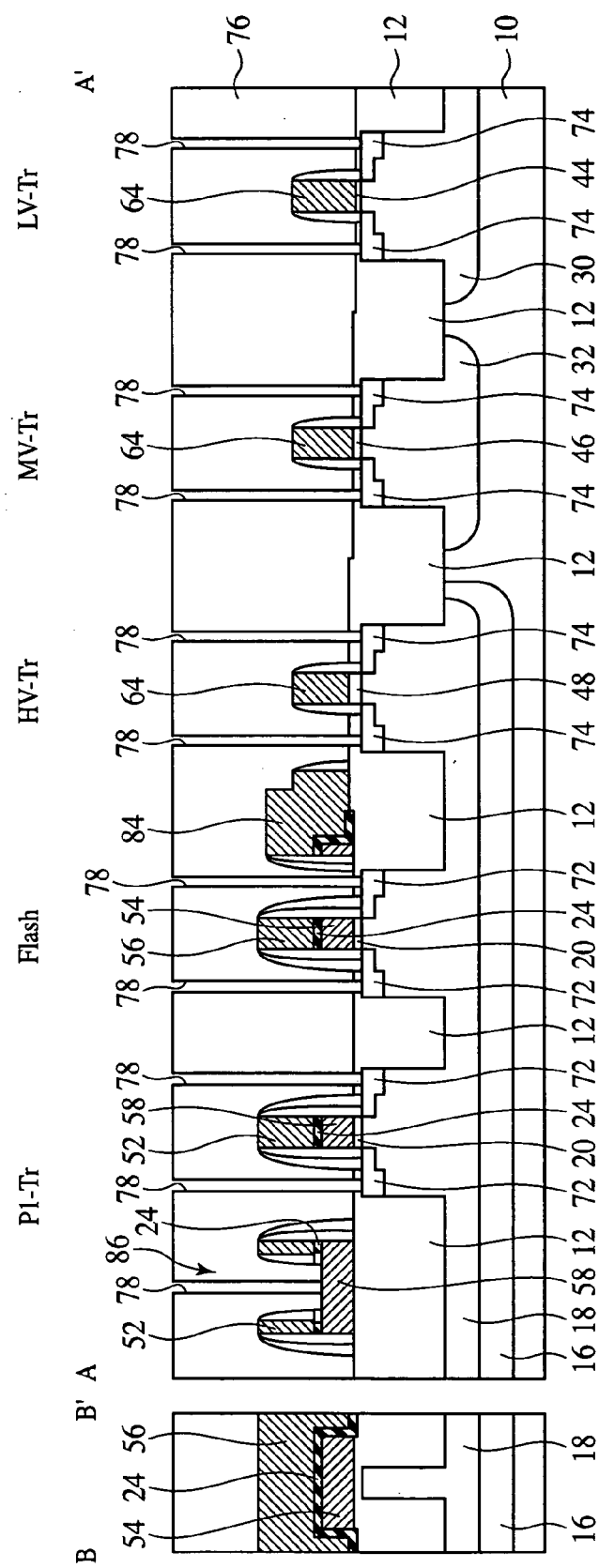

Next, by photolithography and dry etching, contact holes 78 down to the source/drain regions and the gate electrodes of the respective transistors are formed in the inter-layer insulating film 76 (FIG. 16). At this time, the contact hole 78 can be formed down to the gate electrode 58 of the Poly-1 transistor (P1-Tr), on the ONO film 24 is absent, simultaneously with opening the contact holes 70 down to the source/drain regions and to the gate electrodes 58 of the rest transistors.

Then, the contact plugs buried in the contact holes 78 and the multi-level interconnections are formed, and the semiconductor device is completed.

As described above, according to the present embodiment, in the multiple oxidation process for forming the plural kinds of gate insulating film of different film thicknesses, the inter-gate insulating film in the region for the contact to the gate electrode of the Poly-1 transistor to be formed in is removed, whereby the silicon substrate and the device isolation film can be prevented from being damaged by the etching in the step of removing the inter-gate insulating film. Thus, changes of the characteristics of the peripheral transistors can be prevented.

The inter-gate insulating film in the region for the contact to the gate electrode of the Poly-1 transistor can be removed by only adding an opening for exposing the region for the contact to the gate electrode of the Poly-1 transistor, which makes it unnecessary to add the photoresist process, which much increases the fabrication cost.

The inter-gate insulating film in the region for the contact to the gate electrode of the Poly-1 transistor to be formed in is removed in advance before the inter-layer insulating film is formed, which makes it possible to use the borderless contact.

Thus, the method for fabricating the semiconductor device according to the present embodiment is suitable to facilitate the fabrication of a logic semiconductor device combined with a nonvolatile semiconductor memory without making the fabrication process complicated, ensuring the compatibility with the fabrication processes of the leading logic devices.

A Second Embodiment

The method for fabricating the semiconductor device according to a second embodiment of the present invention will be explained with reference to FIGS. 17A to 18B. The same members of the present embodiment as those of the semiconductor device according to the first embodiment and the method for fabricating the same are represented by the same reference numbers not to repeat or to simplify their explanation.

FIGS. 17A to 18B are sectional views showing the steps of the method for fabricating the semiconductor device according to the present embodiment.

According to the present embodiment, in the method for fabricating the semiconductor device according to the first embodiment, the first polycrystalline silicon film in the same level as the floating gate is patterned by hard mask process.

First, in the same way as in, e.g., the method for fabricating the semiconductor device according to the first embodiment shown in FIGS. 10A and 10B, a device isolation film 12, an n-well 16 and a p-well 18 are formed in the silicon substrate 10.

Next, the silicon substrate 10 is thermally oxidized by, e.g., thermal oxidation method to form a tunnel gate insulating film 20 of the silicon oxide film on the surface of the device regions defined by the device isolation film 12.

Next, on the silicon substrate 10 with the tunnel gate insulating film 20 formed on, a polycrystalline silicon film 22 is deposited by, e.g., CVD method.

Next, on the polycrystalline silicon film 22, a silicon nitride film, for example, is deposited by, e.g., CVD method to form a hard mask 38 of the silicon nitride film (FIG. 17A). The hard mask 88 can be another film, such as silicon oxide film or others.

Next, by photolithography and dry etching, the hard mask 88 and the polycrystalline silicon film 22 in the memory cell region containing a nonvolatile memory transistor (Flash) region and a Poly-1 transistor (P1-Tr) region are patterned into prescribed configurations necessary to form the floating gate, and the gate electrode of the Poly-1 transistor. The hard mask 88 and the polycrystalline silicon film 22 in the peripheral circuit region containing the low-voltage transistor (LV-Tr) region, the medium-voltage transistor (MV-Tr) region and the high-voltage transistor (HV-Tr) region remain (FIG. 17B).

In this etching step, etching for processing fine through-pattern having vertical configuration is necessary. As described above, to pattern in fine and vertical configurations and to decrease the etching damage are incompatible requirements for setting the etching conditions.

In the method for fabricating the semiconductor device according to the present embodiment, however, in the peripheral circuit region, which is covered by the polycrystalline silicon film 22, the silicon substrate 10 and the device isolation film 12 of the peripheral circuit region are never damaged by the etching.

Accordingly, the method for fabricating the semiconductor device according to the present embodiment can fabricate the semiconductor device stably, making the etching damage decrease and the fine patterning compatible with each other even when the devices are further downsized.

Figure 18A:
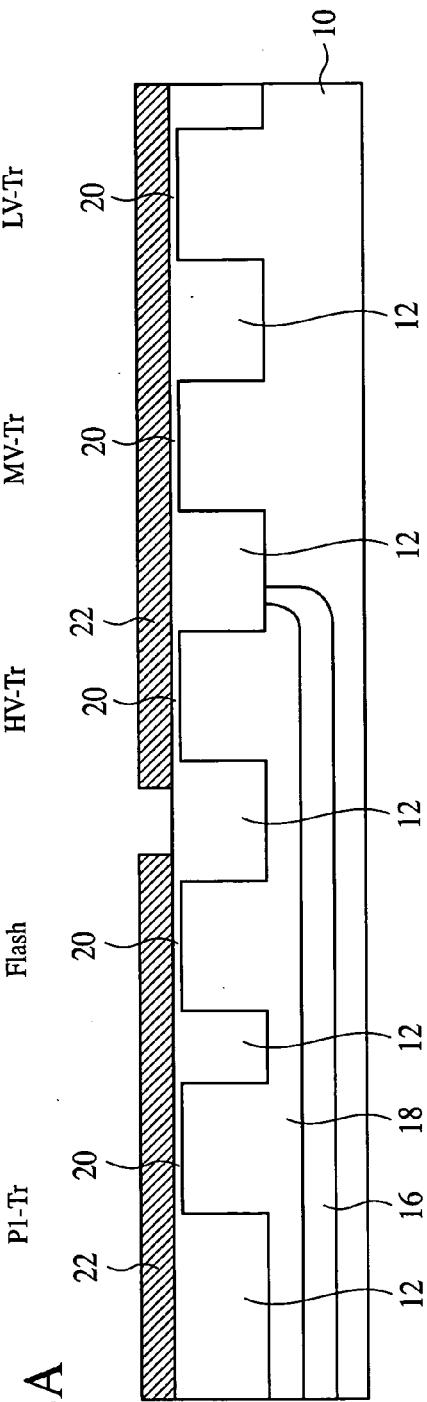

Then, the hard mask 88 remaining on the polycrystalline silicon film 22 is removed by dry etching (FIG. 18A). At this time, in the peripheral circuit region covered by the polycrystalline silicon film 22, the silicon substrate 10 and the device isolation film 12 of the peripheral circuit region are never damaged by the etching of the hard mask 88.

Thus, even when the hard mask process is used, the semiconductor device can be fabricated stably while the etching damage being decreased.

Figure 18B:
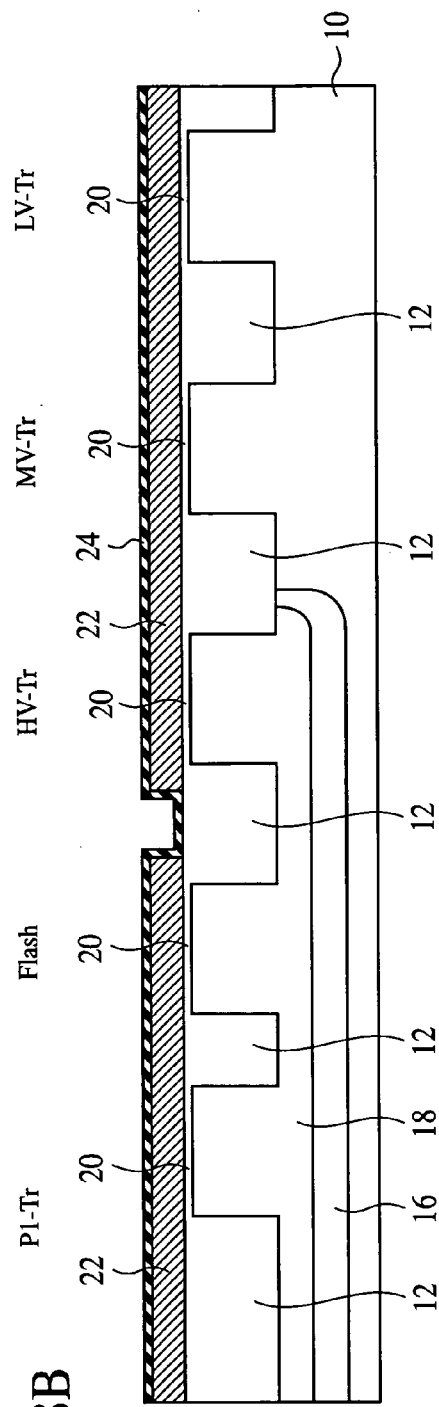

Next, a silicon oxide film and a silicon nitride film are deposited on the entire surface by, e.g., CVD method, and a silicon oxide film is grown by thermal oxidation method to form an ONO film 24 of the silicon oxide film, the silicon nitride film and the silicon oxide film (FIG. 18B).

Then, in the same way as in the method for fabricating the semiconductor device according to the first embodiment shown in, e.g., FIGS. 11B to 16, the semiconductor device is completed.

As described above, according to the present embodiment, even in applying the hard mask process to patterning the polycrystalline silicon film 22, the silicon substrate and the device isolation film are prevented from being damaged by the etching. Thus, changes of the peripheral transistor characteristics can be prevented. Accordingly, the polycrystalline silicon film 22 can be easily patterned in fine, and the semiconductor device can be further downsized.

Modified Embodiments

The present invention is not limited to the above-described embodiments and can cover other various modifications.

For example, in the above-described embodiments, the inter-gate insulating film between the floating gate 54 and the control gate 56 is formed of the ONO film 24, but the inter-gate insulating film may not be essentially ONO film.

For example, the inter-gate insulating film can be also formed of the NO film of a silicon nitride film laid on a silicon oxide film. In this case, the photoresist film 34 or 40 for exposing the contact region 86 of the gate electrode 58 of the Poly-1 transistor (P1-Tr) is formed to remove the inter-gate insulating film in the step of FIG. 12B or FIG. 13B.

The advantageous effect produced by applying the present invention is conspicuous especially in cases that the inter-gate insulating film between the floating gate 54 and the control gate 56 includes an insulating film whose etching characteristics are different from the gate insulating film of the peripheral transistors, e.g., the inter-gate insulating film is an insulating film formed of a silicon oxide film and an insulating film formed on the silicon oxide film and having etching characteristics different from those of the silicon oxide film, the inter-gate insulation has substantially the same etching characteristics as the gate insulating film of the peripheral transistors but is thicker than the latter, etc.

In the above-described embodiments, the floating gate 54 is formed of polycrystalline silicon film but may not be formed essentially polycrystalline silicon film.

What is claimed is:

1. A method of manufacturing a semiconductor device including a first transistor formed in a first region of a semiconductor substrate and having a first gate electrode of a first conductive film, a second transistor formed in a second region of the semiconductor substrate and having a second gate electrode of a second conductive film, and a third transistor formed in a third region of the semiconductor substrate and having a third gate electrode of the second conductive film, the method comprising the steps of:

forming a first insulating film over the semiconductor substrate;

forming the first conductive film over the first insulating film;

forming a second insulating film over the first conductive film;

removing the second insulating film, the first conductive film and the first insulating film formed in the second region and the third region;

forming a third insulating film over the semiconductor substrate in the second region and the third region from which the first insulating film has been removed;

removing the second insulating film in the first region and the third insulating film in the third region with a photoresist film covering the second region and exposing the first region and the third region as a mask;

forming a fourth insulating film over the semiconductor substrate in the third region from which the third insulating film has been removed;

forming the second conductive film over the first conductive film in the first region, the third insulating film in the second region and the fourth insulating film in the third region;

patterning the second conductive film and the first conductive film in the first region to form the first gate electrode of the first conductive film; and patterning the second conductive film to form the second gate electrode and the third gate electrode while removing the second conductive film over the first gate electrode.

2. The method of manufacturing a semiconductor device according to claim 1, wherein the second insulating film includes a first film having the same etching characteristics as the third insulating film, and a second film formed on the first film and having etching characteristics different from the third insulating film, and the step of removing the second insulating film in the first region and the third insulating film in the third region includes the steps of:

selectively removing the second film in the first region with said photoresist film as the mask; and removing the first film in the first region and the third insulating film in the third region with said resist film as the mask.

3. The method of manufacturing a semiconductor device according to claim 2, wherein the first film is a silicon oxide film, and the second film is a silicon nitride film.

4. The method of manufacturing a semiconductor device according to claim 1, further comprising, after the step of forming the first conductive film and before the step of forming the second insulating film, the step of:

patterning the first conductive film in the first region.

5. The method of manufacturing a semiconductor device according to claim 4, wherein in the step of patterning the first conductive film, the first conductive film is left in the second region and the third region.

6. The method of manufacturing a semiconductor device according to claim 4, which further comprises, after the step of forming the first conductive film and before the step of patterning the first conductive film, the step of forming a hard mask over the first conductive film;

in which in the step of patterning the first conductive film, the hard mask is used to pattern to first conductive, and which further comprises, after the step of patterning the first conductive film, the step of removing the hard mask.

7. The method of manufacturing a semiconductor device according to claim 1, wherein the semiconductor substrate includes a fourth region for a nonvolatile memory transistor to be formed in, and in the step of forming the first gate electrode, the second conductive film, the second insulating film and the first conductive film in the fourth region are patterned to thereby form a floating gate of the first conductive film and a control gate of the second conductive film in the fourth region.

8. The method of manufacturing a semiconductor device according to claim 1, wherein in the step of forming the fourth insulating film, the semiconductor substrate is oxidized or oxynitridized to form the fourth insulating film.

9. The method of manufacturing a semiconductor device according to claim 1, wherein in the step of forming the third insulating film, the semiconductor substrate is oxidized or oxynitridize to form the third insulating film.

10. A method of manufacturing a semiconductor device including a first transistor formed in a first region of a semiconductor substrate and having a first gate electrode of a first conductive film, a second transistor formed in a second region of the semiconductor substrate and having a second gate electrode of a second conductive film, a third transistor formed in a third region of the semiconductor substrate and having a third gate electrode of the second conductive film, and a fourth transistor formed in a fourth region of the semiconductor substrate and having a fourth gate electrode of the second conductive film, the method comprising the steps of:

forming a first insulating film over the semiconductor substrate;

forming the first conductive film over the first insulating film;

forming over the first conductive film a second insulating film including a first film, a second film formed on the first film and having etching characteristics different from those of the first film, and a third film formed on the second film and having etching characteristics different from those of the second film;

removing the second insulating film, the first conductive film and the first insulating film formed in the second region, the third region and the fourth region;

forming a third insulating film over the semiconductor substrate in the second region, the third region and the fourth region from which the first insulating film has been removed;

removing the third film in the first region, and the third insulating film in the third region and the fourth region with a first resist film covering the second region and exposing the first region, the third region and the fourth region as a mask;

forming a fourth insulating film over the semiconductor substrate in the third region and the fourth region from which the third insulating film has been removed;

removing the second film and the first film in the first region, and the fourth insulating film in the fourth region with a second resist film covering the second region and the third region and exposing the first region and the fourth region as a mask;

forming a fifth insulating film over the semiconductor substrate in the fourth region from which the fourth insulating film has been removed;

forming the second conductive film over the first conductive film in the first region, the third insulating film in the second region, the fourth insulating film in the third region and the fifth insulating film in the fourth region;

patterning the second conductive film and the first conductive film in the first region to form the first gate electrode of the first conductive film; and patterning the second conductive film to form the second gate electrode, the third gate electrode and the fourth gate electrode while removing the second conductive film over the first gate electrode.

11. The method of manufacturing a semiconductor device according to claim 10, wherein the step of removing the second film and the first film in the first region and the fourth insulating film in the fourth region includes the steps of:

selectively removing the second film in the first region with the second resist film as a mask; and removing the first film in the first region and the third insulating film in the third region with the second resist film as a mask.

12. The method of manufacturing a semiconductor device according to claim 10, wherein the first film is a silicon oxide film, the second film is a silicon nitride film, and the third film is a silicon oxide film.

13. The method of manufacturing a semiconductor device according to claim 10, further comprising, after the step of forming the first conductive film and before the step of forming the second insulating film, the step of:

patterning the first conductive film in the first region.

14. The method of manufacturing a semiconductor device according to claim 13, wherein in the step of patterning the first conductive film, the first conductive film is left in the second region, the third region and the fourth region.

15. The method of manufacturing a semiconductor device according to claim 13, which further comprises, after the step of forming the first conductive film and before the step of patterning the first conductive film, the step of forming a hard mask over the first conductive film, in which, in the step of patterning the first conductive film, the first conductive film is patterned by using the hard mask, and which further comprises, after the step of patterning the first conductive film, the step of removing the hard mask.

16. The method of manufacturing a semiconductor device according to claim 10, wherein the semiconductor substrate includes a fifth region for a nonvolatile memory transistor to be formed in, in the step of forming the first gate electrode, the second conductive film, the second insulating film and the first conductive film in the fifth region are patterned to form a floating gate of the first conductive film and a control gate of the second conductive film in the fifth region.

17. The method of manufacturing a semiconductor device according to claim 10, wherein in the step of forming the fifth insulating film, the semiconductor substrate is oxidized or oxynitridize to form the fifth insulating film.

18. The method of manufacturing a semiconductor device according to claim 10, wherein in the step of forming the fourth insulating film, the semiconductor substrate is oxidized or oxynitridize to form the fourth insulating film.

19. The method of manufacturing a semiconductor device according to claim 10, wherein in the step of forming the third insulating film, the semiconductor substrate is oxidized or oxynitridize to form the third insulating film.

* * * * *